US011539027B2

(12) United States Patent
Nakamura et al.

(10) Patent No.: US 11,539,027 B2
(45) Date of Patent: Dec. 27, 2022

(54) LUMINESCENT THIN FILM, LUMINESCENT MULTILAYERED FILM, AND ORGANIC ELECTROLUMINESCENT DEVICE, AND PRODUCTION METHOD THEREFOR

(71) Applicant: Konica Minolta, Inc., Tokyo (JP)

(72) Inventors: Yuta Nakamura, Hino (JP); Satoru Inoue, Kunitachi (JP)

(73) Assignee: KONICA MINOLTA, INC., Tokyo (JP)

( * ) Notice: Subject to any disclaimer, the term of this patent is extended or adjusted under 35 U.S.C. 154(b) by 95 days.

(21) Appl. No.: 16/955,646

(22) PCT Filed: Jan. 9, 2019

(86) PCT No.: PCT/JP2019/000267
§ 371 (c)(1),
(2) Date: Jun. 18, 2020

(87) PCT Pub. No.: WO2019/146396
PCT Pub. Date: Aug. 1, 2019

(65) Prior Publication Data
US 2020/0388787 A1 Dec. 10, 2020

(30) Foreign Application Priority Data
Jan. 24, 2018 (JP) .............................. JP2018-009291

(51) Int. Cl.
*H01L 51/50* (2006.01)
*H05B 33/10* (2006.01)
(Continued)

(52) U.S. Cl.
CPC ...... *H01L 51/5253* (2013.01); *H01L 51/0026* (2013.01); *H01L 51/56* (2013.01); *H01L 51/0097* (2013.01); *H01L 2251/5376* (2013.01)

(58) Field of Classification Search
CPC ..... H05B 33/26; H05B 33/10; H01L 51/5016; H01L 51/0072; H01L 51/5376; H01L 51/5024; H01L 2251/5376
See application file for complete search history.

(56) References Cited

U.S. PATENT DOCUMENTS

2005/0008424 A1*  1/2005  Nelson .................. C09D 11/36
                                                              401/292
2006/0047174 A1   3/2006  Begley et al.
(Continued)

FOREIGN PATENT DOCUMENTS

JP   2008-060024 A      3/2008
JP   2012-178328 A  *   7/2011  ............. H05B 33/10
(Continued)

OTHER PUBLICATIONS

Translation of JP2012-178328 A (Sasa Shiuchi) (Jul. 20, 2011). (Year: 2011).*
(Continued)

*Primary Examiner* — Caridad Everhart
(74) *Attorney, Agent, or Firm* — Lucas & Mercanti, LLP

(57) ABSTRACT

The present invention addresses the problem of providing: a luminescent thin film, a luminescent multilayered film, and an organic electroluminescent element that have luminescence properties with excellent storage stability in atmospheric air; and a production method therefor. This luminescent thin film contains a luminescent compound A, and is characterized by containing 0.0001 mass % or more of an oxide B of luminescent compound A in terms of the luminescent compound A.

19 Claims, 4 Drawing Sheets

(51) Int. Cl.
*H01L 51/52* (2006.01)
*H01L 51/00* (2006.01)
*H01L 51/56* (2006.01)

(56) References Cited

U.S. PATENT DOCUMENTS

| | | | | |
|---|---|---|---|---|
| 2010/0051928 A1* | 3/2010 | Fukuzaki | ............ | H01L 51/0059 548/242 |
| 2013/0240844 A1* | 9/2013 | Nakatsuka | .............. | H01L 51/56 257/40 |
| 2016/0020397 A1* | 1/2016 | Sannomiya | ......... | H01L 51/0072 252/301.16 |
| 2019/0044084 A1* | 2/2019 | O'Carroll | ........... | H01L 51/5056 |

FOREIGN PATENT DOCUMENTS

| JP | 2011-216473 A | 10/2011 | | |
|---|---|---|---|---|
| JP | 2012178328 A | 9/2012 | | |
| JP | 2015-093938 A | 5/2015 | | |
| WO | 2006023369 | * 3/2006 | ......... | H01L 51/0054 |
| WO | 2009/063850 A1 | 5/2009 | | |
| WO | 2013/105557 A1 | 7/2013 | | |

OTHER PUBLICATIONS

PCT, International Search Report for the corresponding application No. PCT/JP2019/000267, dated Apr. 2, 2019, with English translation (4 pages).
International Preliminary Report on Patentability for corresponding application No. PCT/JP2019/000267 dated Jul. 28, 2020 with English translation (14 pages).
JPO, Office Action for corresponding Japanese application No. 2019-567956, dated Mar. 8, 2022, with English translation.
Office Action for corresponding Chinese Application No. 201980009449.5 dated Aug. 3, 2022, with English translation.
Office Action for corresponding Japanese Application No. 2019-567956 dated Sep. 20, 2022, with English translation.

* cited by examiner

LUMINESCENT THIN FILM, LUMINESCENT MULTILAYERED FILM, AND ORGANIC ELECTROLUMINESCENT DEVICE, AND PRODUCTION METHOD THEREFOR

CROSS REFERENCE TO RELATED APPLICATION

This Application is a 371 of PCT/JP2019/000267 filed on Jan. 9, 2019, which, in turn, claimed the priority of Japanese Patent Application No. 2018-009291 filed on Jan. 24, 2018, both applications are incorporated herein by reference.

TECHNICAL FIELD

The present invention relates to a luminescent thin film, a multilayer film, an organic electroluminescent element, and a method of manufacturing the same. More particularly, the present invention relates to a luminescent thin film and a luminescent multilayer film which have excellent luminescence characteristics in storage stability under the atmosphere, and an organic electroluminescent element using the same.

BACKGROUND

A thin film having a luminescent function (hereinafter referred to as a luminescent thin film) has been demanded more and more in recent years when a thin luminescent element is demanded. In particular, in recent years, organic electroluminescent (EL) elements having a luminescent thin film as a light-emitting layer and emitting light by carrier recombination have been actively developed. Fluorescent materials, phosphorescent materials, and thermally activated delayed fluorescent materials have attracted attention as luminescent materials used for the light-emitting layer, and many inventions have been made on improvement of luminescent characteristics and improvement of driving stability.

On the other hand, conventionally, the storage stability of the luminescent thin film under the atmosphere is low, which is a major problem. It is known that in a luminescent material, in particular, a phosphorescent material, light emission is inhibited or material is deteriorated due to the influence of oxygen or water in the atmosphere, and luminescent characteristics are deteriorated in the atmosphere. Therefore, when manufacturing a luminescent thin film, a process that avoids the atmosphere as much as possible, such as vacuum evaporation or coating under an inert gas atmosphere, is the main stream, and this is a large factor in increasing the manufacturing cost.

In addition, in the manufactured organic EL element, a high barrier sealing step is required to prevent deterioration of the light emitting layer in the element, which is a factor for further increase in cost. This is the reason why the practical use of organic EL has not progressed.

In view of the above-mentioned background, studies have been made to improve the storage stability of a luminescent material in the atmosphere by a simple method. For example, as described in Patent Document 1, an invention has been made in which a phenolic antioxidant is contained together with a luminescent material to improve storage stability in the atmosphere. However, even in a composition containing a luminescent material having excellent storage stability under the atmosphere in the solution state as in the above-mentioned invention, when the film is formed, the storage stability is not sufficient, and there has been a problem that the luminescent characteristics are deteriorated in storage under the atmosphere.

PRIOR ART DOCUMENT

Patent Document

Patent Document 1: JP-A 2015-93938

SUMMARY OF THE INVENTION

Problems to be Solved by the Invention

The present invention has been made in view of the above problems and status. An object of the present invention is to provide a luminescent thin film, a multilayer film, an organic electroluminescent element, and a manufacturing method thereof, which have excellent luminescent characteristics in storage stability under the atmosphere.

Means to Solve the Problems

In order to solve the above-mentioned problems, the present inventor has found that, in the process of examining the cause of the above-mentioned problems, the luminescent thin film containing the luminescent compound A contains an oxide B of the luminescent compound A in a specific amount or more with respect to the luminescent compound A, whereby the luminescent thin film having excellent storage stability under the air in luminescent characteristics can be obtained.

That is, the above-mentioned problem according to the present invention is solved by the following means.
1. A luminescent thin film comprising a luminescent compound A, wherein the luminescent thin film contains 0.0001 mass % or more of an oxide B of the luminescent compound A with respect to the luminescent compound A.
2. The luminescent thin film according to item (1), wherein a molecular weight of the oxide B satisfies the following Equation (1).

$$Mw(B)=Mw(A)+(16m+18n) \qquad \text{Equation (1):}$$

Wherein Mw(A) represents a molecular weight of the luminescent compound A, Mw(B) represents a molecular weight of the oxide B, m and n each represent 0 or an integer, respectively, provided that $m+n \geq 1$.
3. The luminescent thin film according to item 1, wherein a content of the oxide B is in the range of 0.001 to 100 mass % with respect to the luminescent compound A.
4. The luminescent thin film according to any one of items 1 to 3, wherein the luminescent compound A is a phosphorescent compound or a thermally activated delayed fluorescent compound.
5. The luminescent thin film according to item 4, wherein the phosphorescent compound is a phosphorescent complex containing a 5-membered heterocyclic skeleton.
6. The luminescent thin film according to any one of items 1 to 5, wherein the oxide B has any one of a hydroxy group, a phenolic hydroxy group, an epoxy group, and a carbonyl group.
7. A luminescent multilayer film comprising a first layer and a second layer in this order, wherein the first layer is the luminescent thin film according to any one of items 1 to 6.
8. The luminescent multilayer film according to item 7, wherein the second layer contains a compound having a lone electron pair.

9. The luminescent multilayer film according to item 8, wherein the compound having the lone electron pair is a nitrogen-containing compound.

10. The luminescent multilayer film according to item 7, wherein the second layer contains a fluorine compound.

11. The luminescent multilayer film according to item 10, wherein the fluorine compound functions as a fluorine solvent at normal temperature and normal pressure.

12. The luminescent multilayer film according to item 11, wherein a content of the fluorine solvent is in the range of 0.01 to 10 mass %.

13. An organic electroluminescent element comprising the luminescent thin film according to any one of items 1 to 6 or the luminescent multilayer film according to any one of items 7 to 12 between a pair of electrodes.

14. The organic electroluminescent element according to item 13, wherein at least one of the electrodes has a work function of 4.2 eV or more.

15. A method of manufacturing the luminescent thin film according to any one of items 1 to 6, the method comprising the steps of:

forming a first coating film on a base material using a coating solution A in an atmospheric environment (step A); and drying the first coating film with carrying out a drying process other than atmospheric pressure heat drying in an atmospheric environment.

16. A method of manufacturing the luminescent multilayer film according to any one of items 7 to 12, the method comprising the steps of:

forming a first coating film on a base material using a coating solution A in an atmospheric environment (step A);

drying the first coating film with carrying out a drying process other than atmospheric pressure heat drying in an atmospheric environment;

forming a second coating film on the first coating film using a coating solution B different from the coating solution A in an atmospheric environment (step B); and drying the first coating film and the second coating film in an atmospheric environment (step C) after the step B, provided that the first coating film and the second coating film are formed in this order.

17. A method of manufacturing a luminescent multilayer film according to any one of items 7 to 12, the method comprising the steps of:

forming a first coating film on a base material using a coating solution A in an atmospheric environment (step A);

forming a second coating film on the first coating film using a coating solution B different from the coating solution A in an atmospheric environment (step B) after the step A; and drying the first coating film and the second coating film in an atmospheric environment (step C) after the step B, provided that the first coating film and the second coating film are formed in this order.

18. A method of manufacturing an organic electroluminescent element, comprising the step of manufacturing the luminescent thin film according to item 15 or the step of manufacturing the luminescent multilayer film according to item 16 or 17.

Effect of the Invention

According to the above-mentioned means of the present invention, it is possible to provide a luminescent thin film, a luminescent multilayer film, an organic electroluminescent element, and a method for manufacturing the same, which have luminescent characteristics excellent in storage stability under the atmosphere. Hereinafter, in the present invention, "storage stability under the atmosphere" is simply referred to as "atmospheric storage stability" or "atmospheric stability".

The expression mechanism or action mechanism of the effect of the present invention is not clarified, but is inferred as follows.

<Interaction of Luminescent Material in Film>

It is known that the luminescent characteristics of a luminescent thin film in which a luminescent material is contained in the film change depending on the concentration of the luminescent material (see, for example, JP-A 2009-37981). This is because the exciton energy is transferred by the interaction between the luminescent molecules, and it is considered that the luminescent material is present in a state of being partially close to and aggregated in the film from a microscopic point of view.

<Factor for Degradation of Storage Stability of Luminescent Thin Film Under Atmosphere>

FIG. 1 is a schematic diagram of a film containing a luminescent compound A when left in the air. As described above, the luminescent compound A exists in a partially aggregated state. As shown in FIG. 1, when the luminescent thin film is stored under the atmosphere, oxygen and moisture in the atmosphere penetrate into the film and approach the vicinity of the luminescent compound A. At this time, quenching by water or oxygen or deterioration of the luminescent compound A occurs, which causes deterioration of the luminescent function of the luminescent film. That is, the approach of the air to the vicinity of the luminescent compound A is a factor of the decrease of the luminescent function.

<Configuration of Luminescent Thin Film of the Present Invention>

In view of the above problems, the present inventors have investigated a luminescent thin film having excellent storage stability under the atmosphere, and as a result, have found that the film containing the luminescent compound A and the oxide B of the luminescent compound A is excellent in storage stability under the atmosphere.

<Expression Mechanism of Atmospheric Stable Luminescent Characteristics>

An expression mechanism of the atmosphere stable luminescent characteristic according to the present invention is estimated as follows.

The oxide B according to the present invention is preferably an oxide having a molecular weight represented by Equation (1), and specifically an oxide having an oxygen-containing substituent on the same skeleton as that of the luminescent compound A. The oxygen-containing substituent captures oxygen and moisture in the air and acts as an antioxidant of the luminescent compound A (hereinafter, the oxide B may be referred to as an antioxidant).

At this time, since the oxide B has the same basic skeleton as that of the luminescent compound A, there is no significant change in the aggregated form thereof as shown in FIG. 2, and the oxide B can exist in the vicinity of the luminescent compound A. That is, when water and oxygen in the atmosphere approach the luminescent compound A, oxygen and water are preferentially adsorbed to the oxide B existing in the vicinity, and the luminescent compound A can be efficiently protected.

On the other hand, as shown in FIG. 3, when the known antioxidant C is contained in the thin film, the interaction with the luminescent compound A is not sufficient, and the antioxidant C tends to exist in a dispersed form in the film.

Therefore, it is presumed that the oxidation preventing function of the luminescent compound A is weaker than that when the oxide B according to the present invention is used, and that the film cannot exhibit atmosphere stable luminescent characteristics.

<Types of Luminescent Compound A>

As the luminescent compound A, a known luminescent compound can be freely selected and used regardless of the luminescence type such as fluorescence emission, phosphorescence emission, and thermally activated delayed fluorescence emission. The coating solution A may contain only one type of luminescent compound or two or more types of luminescent compounds.

Since the luminescence lifetime ($\tau$) of the phosphorescent compound and the thermally activated delayed fluorescent compound is as long as several μs or more, the phosphorescent compound and the thermally activated delayed fluorescent compound are susceptible to luminescence inhibition due to entry of air into the luminescent layer, or oxidative degradation of the luminescent compound. In the luminescent thin film according to the present invention containing oxide B at the same time, it is considered that the occurrence of such luminescence inhibition can be effectively suppressed. Therefore, when the phosphorescent compound and the thermally activated delayed fluorescent compound are used as the luminescent compound, the effect of the present invention can be more effectively obtained.

More preferably, the luminescent compound A is a phosphorescent complex containing a 5-membered heterocyclic skeleton. According to the investigation in the present invention, it was found that the atmospheric stability of the phosphorescent complex containing the 5-membered heterocyclic skeleton was lower than that of the phosphorescent complex of the other skeleton. Therefore, when a phosphorescent complex containing a 5-membered aromatic heterocyclic skeleton is used as the luminescent compound, the effect of the present invention can be more effectively obtained.

EMBODIMENTS TO CARRY OUT THE INVENTION

Figure 1:
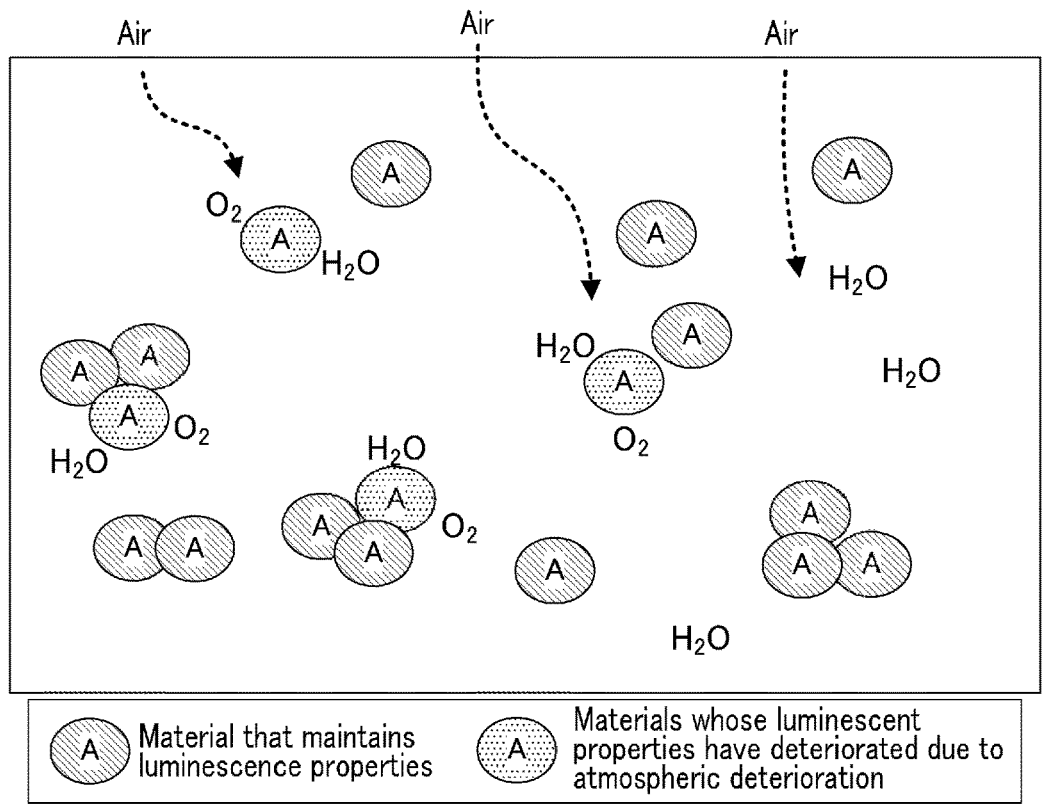
FIG. 1 is a schematic diagram of a film containing a luminescent compound A when left in the air.
Figure 2:
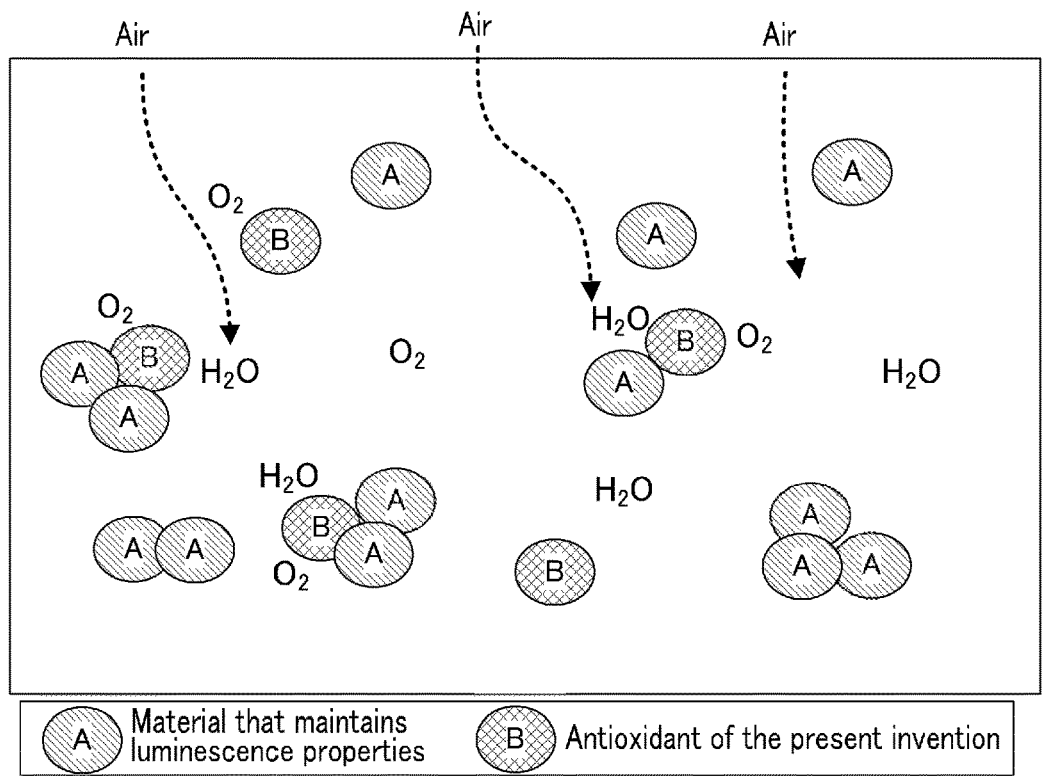
FIG. 2 is a schematic diagram of a film containing a luminescent compound A and an oxide B when left in the air.
Figure 3:
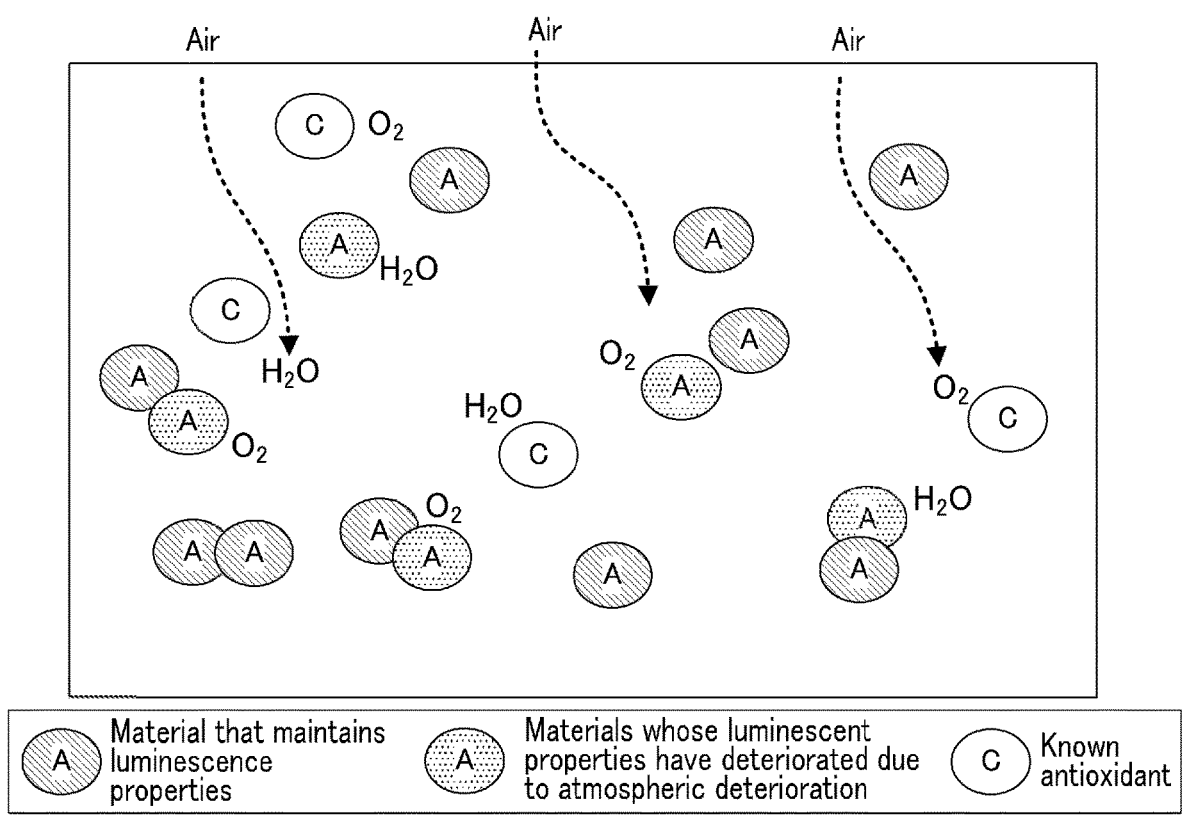
FIG. 3 is a schematic diagram of a case where a known antioxidant C is contained in a thin film.

The luminescent thin film of the present invention is a luminescent thin film containing a luminescent compound A, and is characterized in that it contains 0.0001 mass % or more of the oxide B of the luminescent compound A with respect to the luminescent compound A. This feature is a technical feature common to or corresponding to the embodiments described below.

In an embodiment of the present invention, from the viewpoint of the effect expression of the present invention, it is preferable that the molecular weight of the oxide B satisfies Equation (1) from the standpoint of further improving storage stability in the air. The preferable range of "m+n" is 1≤(m+n)≤20. This is preferable because it does not cause luminescence inhibition due to decomposition of the oxide B.

In addition, it is preferable that the content of the oxide B is within the range of 0.001 to 100 mass % with respect to the luminescent compound A from the viewpoint of further improving storage stability in the air. Within this range, not only the effect of the present invention is effectively exhibited, but also bleed-out of the oxide B from the thin film does not occur.

When the luminescent compound A is a phosphorescent luminescent material or a thermally activated delayed fluorescent material, as described above, the luminescent compound A has a long luminescence lifetime ($\tau$) of several μs or more, and it is susceptible to luminescence inhibition due to entry of air into the light-emitting layer or oxidative degradation of the luminescent material, the effect of the present invention is more effectively exhibited.

Further, when the phosphorescent material is a phosphorescent complex containing a 5-membered heterocyclic skeleton, the atmospheric stability is lower than that of the phosphorescent complex of the other skeleton, so that the effect of the present invention is more effectively exhibited.

It is preferable that the oxide B has any one of a hydroxy group, a phenolic hydroxy group, an epoxy group, and a carbonyl group from the viewpoint of further improving storage stability in the air.

In the present invention, a luminescent multilayer film comprises a first layer and a second layer in this order, and it is characterized in that the first layer is a luminescent thin film of the present invention.

In addition, it is preferable to contain a compound having a lone electron pair in the second layer, and it is preferable that the compound having the lone electron pair is a nitrogen-containing compound from the viewpoint of effectively expressing a protective function as a protective film and further improving storage stability in the air.

In addition, it is preferable to contain a fluorine compound in the second layer, and it is preferable that the fluorine compound is a solvent at normal temperature and normal pressure from the viewpoint of a protective function and productivity as a protective film.

The content of the fluorine solvent in the second layer is preferably 0.01 to 10 mass % or less from the viewpoint of further improving storage stability in the air and not causing a voltage rise due to carrier transport inhibition by the residual solvent when it is used for an element and the element is energized.

As an application example of the present invention, an organic electroluminescent element having a luminescent thin film of the present invention or a luminescent multilayer film of the present invention between a pair of electrodes is preferable from the viewpoint of providing an organic electroluminescent element having excellent storage stability under the atmosphere.

In addition, it is preferable that at least one of the electrodes is an electrode having a work function of 4.2 eV or more from the viewpoint of improving storage stability in the air.

The method for manufacturing a luminescent thin film of the present invention is characterized in that it includes a step A of forming a first coating film on a base material in an atmospheric environment using a coating solution A, and a drying step after the step A except for atmospheric pressure heating and drying in an atmospheric environment. The use of a drying step other than atmospheric pressure heating and drying is preferable from the viewpoint of suppressing generation of by-products involved in quenching of the luminescent compound A by excessive progress of oxidation of the luminescent compound A.

The method for manufacturing a luminescent multilayer film of the present invention is characterized in that it has a step A of forming a first coating film on a base material under an atmospheric environment using the coating solution A, a step B of forming a second coating film on the first coating film under an atmospheric environment using the coating solution B different from the coating solution A through a drying step other than atmospheric pressure heating and drying under an atmospheric environment after the step A, and a step B of drying under an atmospheric environment after the step B, and the first coating film and the second coating film are formed in this order. In this manufacturing method, since the second coating film is formed after the first coating film is formed through a drying step other than atmospheric pressure heating and drying under an atmospheric environment, the oxidation of the luminescent compound A in the first coating film excessively progresses to suppress the generation of by-products involved in quenching of the luminescent compound A, which is preferable from the viewpoint of suppressing the generation of by-products.

The method for manufacturing a luminescent multilayer film includes a step A of forming a first coating film on a base material in an atmospheric environment using a coating solution A, a step B of forming a second coating film on the first coating film in an atmospheric environment using a coating solution B different from the coating solution A, and a step of drying in an atmospheric environment after the step B, wherein the first coating film and the second coating film are formed in this order. This manufacturing method is preferable from the viewpoint of productivity because the first coating film and the second coating film can be continuously manufactured, and is preferable from the viewpoint of suppressing generation of by-products involved in quenching of the light-emitting compound A due to excessive progress of oxidation of the luminescent compound A because the first coating film is collectively dried under the atmosphere in a state protected by the second coating film.

The method for manufacturing an organic electroluminescent element of the present invention is characterized by having either the method for manufacturing a luminescent thin film or the method for manufacturing a luminescent multilayer film.

The present invention and the constitution elements thereof, as well as configurations and embodiments, will be detailed in the following. In the present description, when two figures are used to indicate a range of value before and after "to", these figures are included in the range as a lowest limit value and an upper limit value.

<<Outline of the Luminescent Thin Film of the Present Invention>>

The luminescent thin film of the present invention is a luminescent thin film containing a luminescent compound A, and is characterized in that it contains 0.0001 mass % or more of the oxide B of the luminescent compound A with respect to the luminescent compound A.

In this configuration, since the oxide B has the same basic skeleton as that of the luminescent compound A, there is no significant change in the aggregation form, and the oxide B can exist in the vicinity of the luminescent compound A, and when water and oxygen in the atmosphere approach the luminescent compound A, the oxide B existing in the vicinity preferentially adsorbs oxygen and water and can efficiently protect the luminescent compound A.

The thickness of the luminescent thin film is not particularly limited, but is preferably adjusted to a range of 2 nm to 5 μm, more preferably adjusted to a range of 2 to 500 nm, and even more preferably adjusted to a range of 5 to 200 nm from the viewpoint of homogeneity of the film to be formed, prevention of application of unnecessarily high voltage at the time of luminescence, and improvement of stability of luminescent color with respect to driving current.

(1) Luminescent Thin Film (1.1) Luminescent Compound A

As the luminescent compound A according to the present invention, a known luminescent compound can be freely selected and used regardless of the luminescence type such as fluorescence emission, phosphorescence emission, and thermal activation delayed fluorescence emission. The coating solution A according to the present invention may contain only one type of luminescent compound or two or more types of luminescent compounds.

The luminescent compound A according to the present invention may be a combination of luminescent compounds having different structures, or a combination of a fluorescent compound and a phosphorescent compound. As a result, an arbitrary luminescent color can be obtained.

Figure 4:
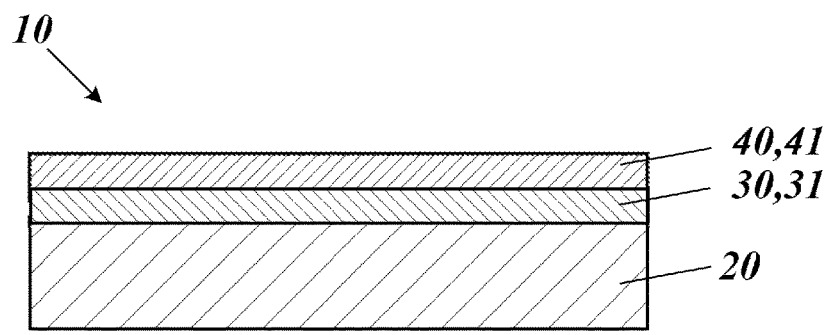
FIG. 4 is a schematic diagram illustrating an example of a layer structure of a luminescent multilayer film of the present invention.

The luminescent color of the present invention luminescent compound is determined in FIG. 4.16 on page 108 of the "New Color Science Handbook" (edited by the Japan Society of Color Sciences, University of Tokyo, 1985), by the color obtained by fitting the results measured by a spectroradiometer CS-1000 (manufactured by Konica Minolta Inc.) to the CIE chromaticity coordinate.

In the present invention, it is also preferable that one or a plurality of luminescent thin films contain a plurality of luminescent dopants having different luminescent colors and exhibit white luminescence.

The combination of the luminescent compound exhibiting white color is not particularly limited, and for example, a combination of blue and orange, and a combination of blue, green and red can be given.

(1.1.1) Phosphorescent Compound

The phosphorescent compound according to the present invention (hereinafter also referred to as "phosphorescent dopant") will be described. The phosphorescent dopant according to the present invention is a compound in which luminescence from an excited triplet is observed, specifically, a compound which emits phosphorescence at room temperature (25° C.). It is define as a compound having a phosphorescence quantum yield of 0.01 or more at 25° C., but a preferable phosphorescence quantum yield is 0.1 or more.

The phosphorescence quantum yield can be measured by the method described on page 398 (1992 edition, Maruzen) of "Spectroscopy II of Experimental Chemical Course 7, 4th edition". The phosphorescence quantum yield in solution can be measured using various solvents, but the phosphorescence dopant according to the present invention may achieve the above phosphorescence quantum yield (0.01 or more) in any of the solvents.

Specific examples of known phosphorescent dopants that can be used in the present invention include compounds described in the following documents. Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991, WO 2008/101842, WO 2003/040257, US 2006/835469, US 2006/0202194, US 2007/0087321, US 2005/0244673, Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290, WO 2002/015645, WO 2009/000673, US 2002/0034656, U.S. Pat. No. 7,332,232, US 2009/0108737, US 2009/0039776, U.S. Pat. Nos. 6,921,915, 6,687,266, US 2007/0190359, US 2006/0008670, US 2009/0165846, US 2008/0015355, U.S. Pat. Nos. 7,250,226, 7,396,598, US 2006/0263635, US 2003/0138657, US 2003/0152802, U.S. Pat. No. 7,090,928, Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002/002714, WO 2006/009024, WO 2006/056418, WO 2005/019373, WO 2005/123873, WO 2005/123873, WO 2007/004380, WO 2006/082742, US 2006/0251923, US 2005/0260441, U.S. Pat. Nos. 7,393,599, 7,534,505, 7,445,855, US 2007/0190359, US 2008/0297033, U.S. Pat. No. 7,338,722, US 2002/0134984, U.S. Pat. No. 7,279,704, US 2006/098120, US 2006/103874, WO 2005/076380, WO 2010/032663, WO 2008/140115, WO 2007/052431, WO 2011/134013, WO 2011/157339, WO 2010/086089, WO 2009/113646, WO 2012/020327, WO 2011/051404, WO 2011/004639, WO 2011/073149, US 2012/228583, US 2012/212126, JP-A 2012-069737, JP-A 2012-19554, JP-A 2009-114086, JP-A 2003-81988, JP-A 2002-302671 and JP-A 2002-363552.

Among them, preferable other phosphorescent dopants are organic metal complexes containing Ir as a center metal. More preferable are complexes containing at least one coordination mode selected from a metal-carbon bond, a metal-nitrogen bond, a metal-oxygen bond and a metal-sulfur bond.

(1.1.2) Fluorescent Materials

The fluorescent compound according to the present invention (hereinafter also referred to as "fluorescent dopant") will be described.

The fluorescent dopant according to the present is a compound capable of emitting light from a singlet excited state, and is not particularly limited as long as light emission from a singlet excited state is observed.

Examples of the other fluorescent dopant are: an anthracene derivative, a pyrene derivative, a chrysene derivative, a fluoranthene derivative, a perylene derivative, a fluorene derivative, an arylacetylene derivative, a styrylarylene derivative, a styrylamine derivative, an arylamine derivative, a boron complex, a coumarin derivative, a pyran derivative, a cyanine derivative, a croconium derivative, a squarylium derivative, an oxobenzanthracene derivative, a fluorescein derivative, a rhodamine derivative, a pyrylium derivative, a perylene derivative, a polythiophene derivative, and a rare earth complex compound.

(1.1.3) Thermally Activated Delayed Fluorescence Emitting Materials

Examples of thermally activated delayed fluorescent materials include, but are not limited to, compounds described in Adv. Mater. 2014, DOI: 10.1002/adma.201402532, WO 2011/156793, JP-A 2011-213643, and JP-A 2010-93181.

(1.2) Oxide B

The oxide B according to the present invention is an oxide of the luminescent compound A, and preferably has a molecular weight satisfying the following Equation (1).

$$Mw(B)=Mw(A)+(16m+18n)$$ Equation (1):

(where Mw(A) represents the molecular weight of the luminescent compound A, Mw(B) represents the molecular weight of the oxide B, m and n each represent 0 or an integer, respectively, where $m+n \geq 1$.)

More specifically, the oxide B is an oxide having an oxygen-containing substituent on the same skeleton as that of the luminescent compound A. There is no limitation on the number or type of substituents for adsorbing oxygen and water in the atmosphere, and it is preferable that the substituents contain any one of a hydroxy group, a phenolic hydroxy group, a carbonyl group, and an epoxy group.

Specifically, m and n are each preferably in the range of 0 to 20, more preferably in the range of 0 to 10.

As an example, a combination of a light-emitting compound A (A-1 to A-9) and an oxide B (B-1 to B-9) includes the following structures.

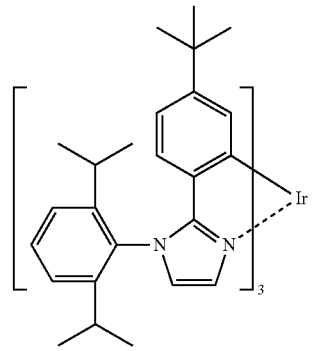

A-1

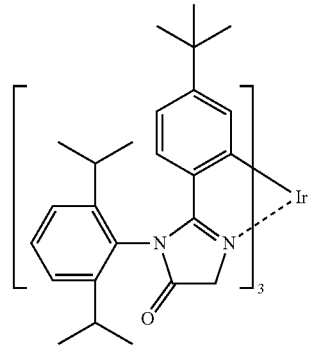

B-1-1

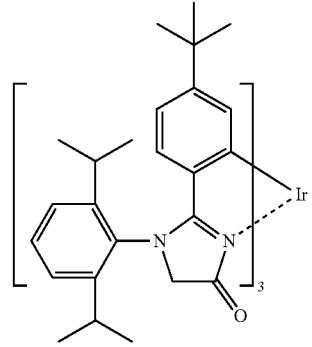

B-1-2

-continued
B-1-3
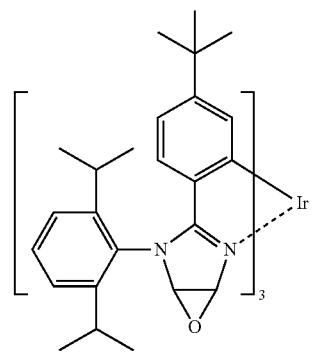
B-1-4
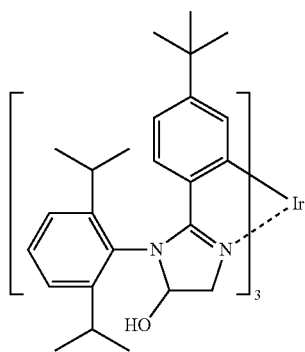
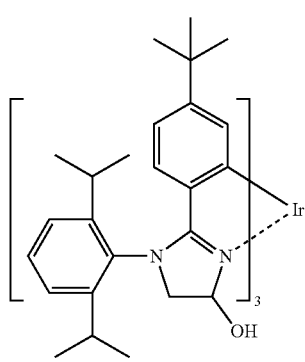
B-1-8
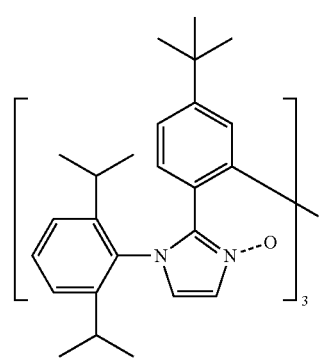
B-1-5
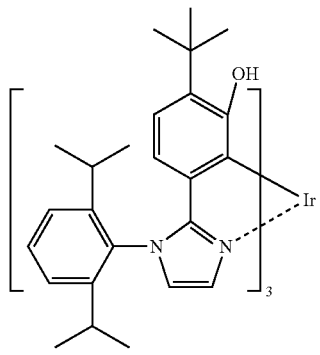
B-1-9
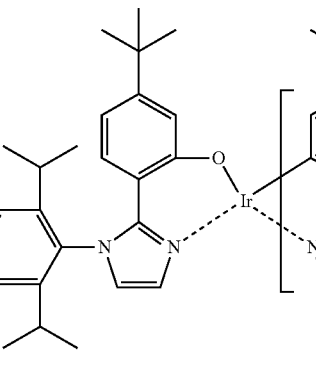
B-1-6
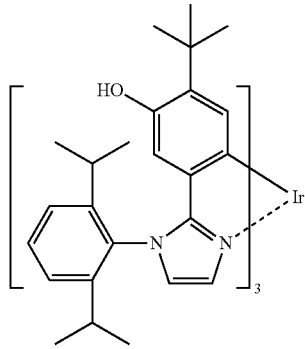
B-1-10
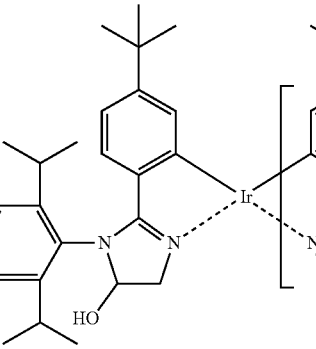

B-1-11
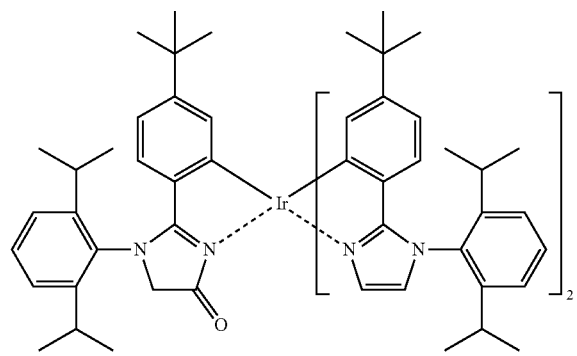
B-1-15
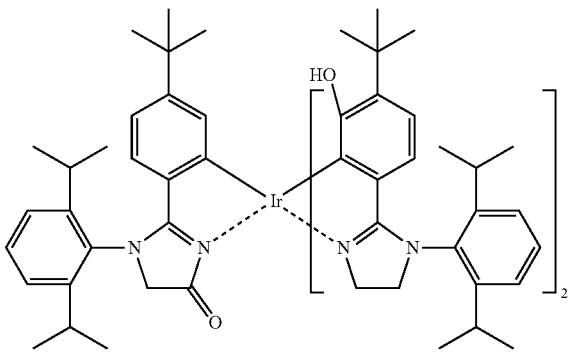
B-1-12
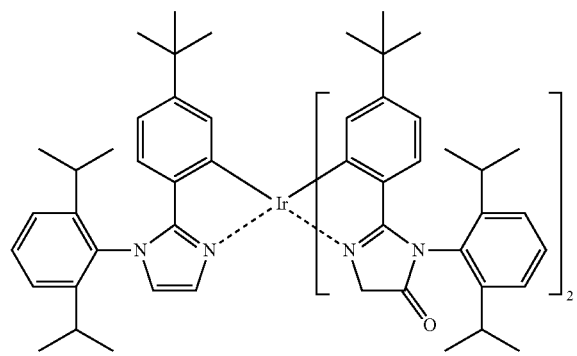
A-2
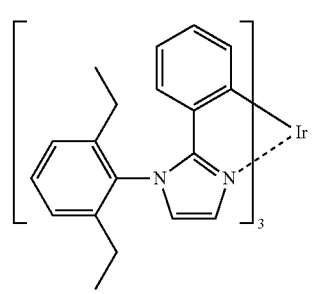
B-1-13
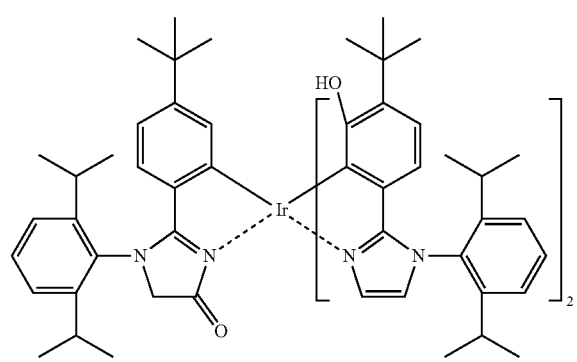
B-2-1
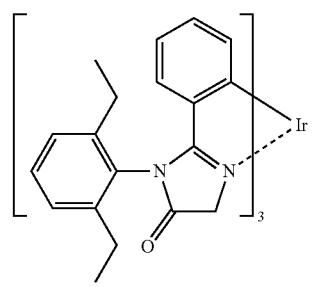
B-2-2
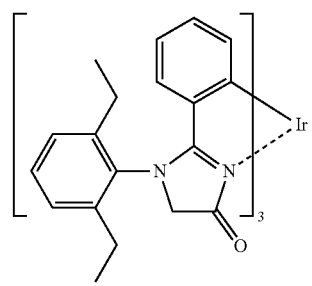
B-1-14
B-2-3
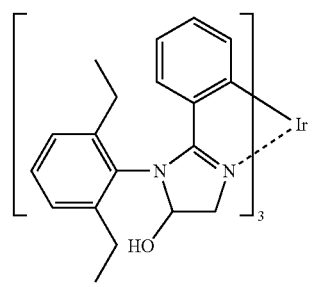

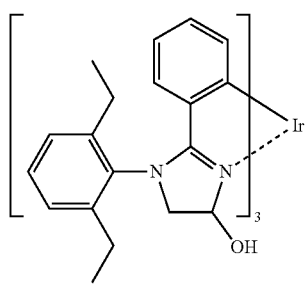
B-2-4
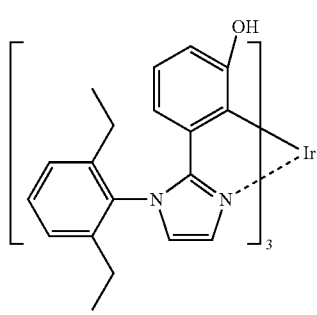
B-2-5
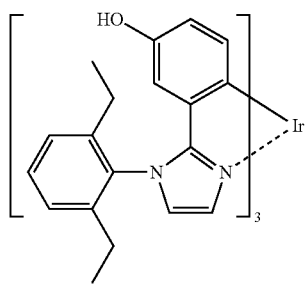
B-2-6
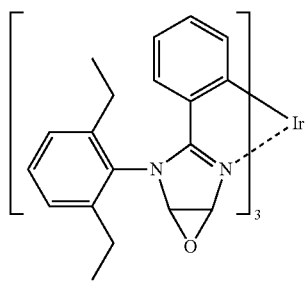
B-2-7
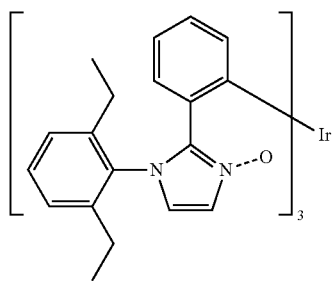
B-2-8
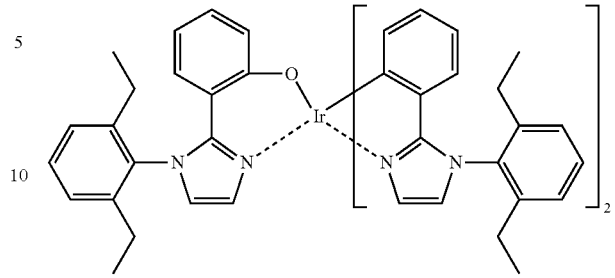
B-2-9
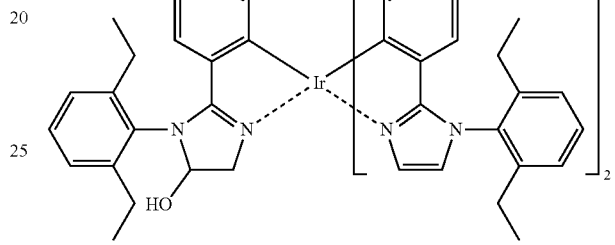
B-2-10
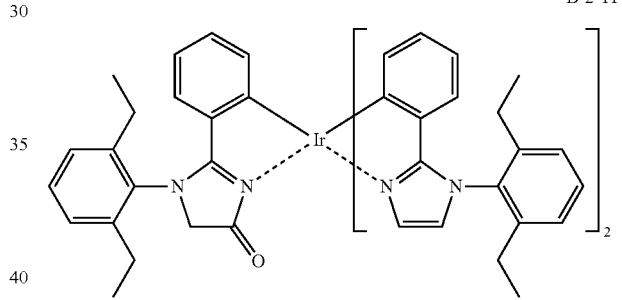
B-2-11
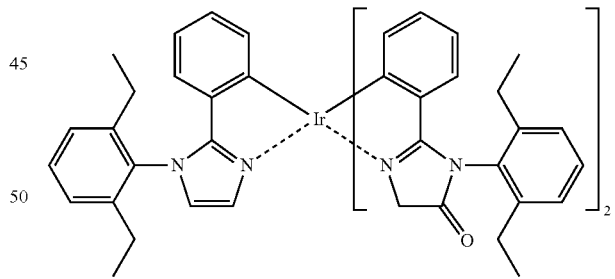
B-2-12
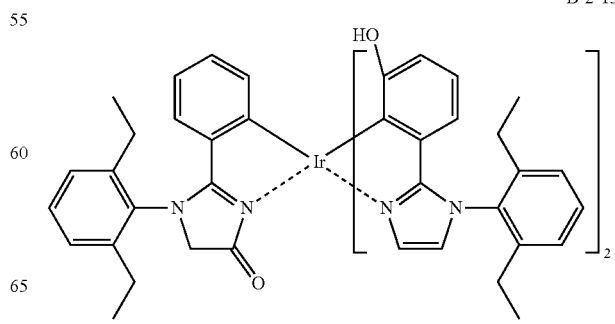
B-2-13

B-2-14
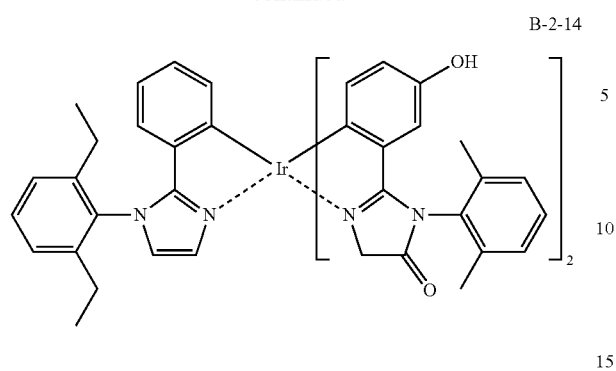
B-2-15
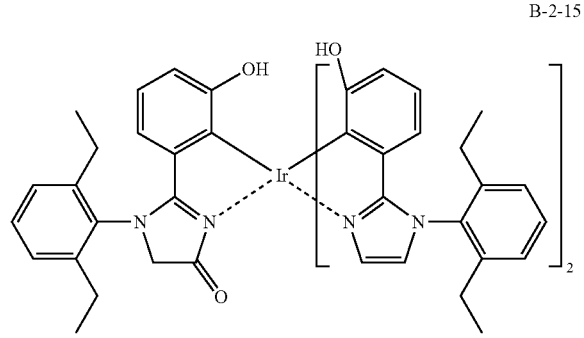
A-3
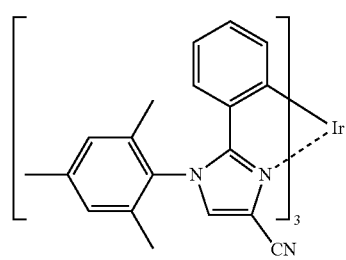
B-3-1
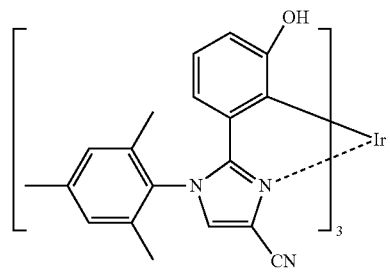
B-3-2
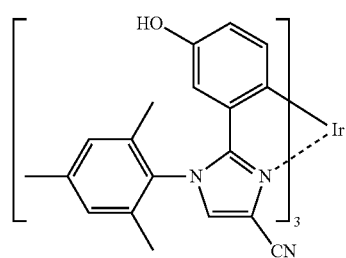
B-3-3
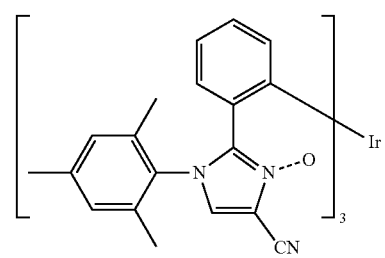
B-3-4
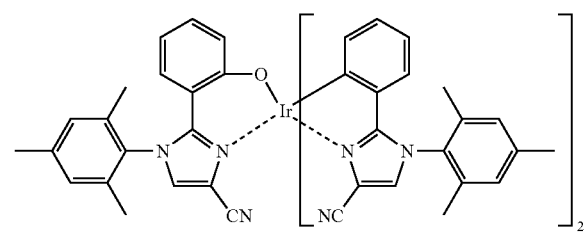
B-3-5
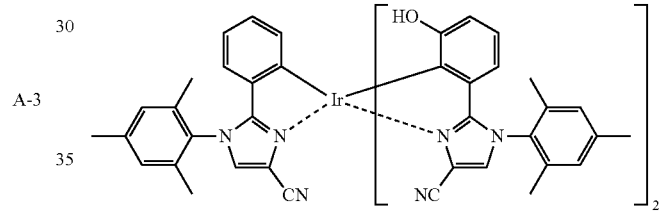
A-4
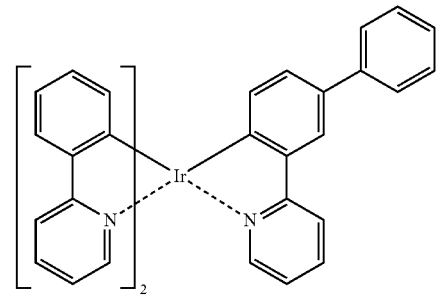
B-4-1
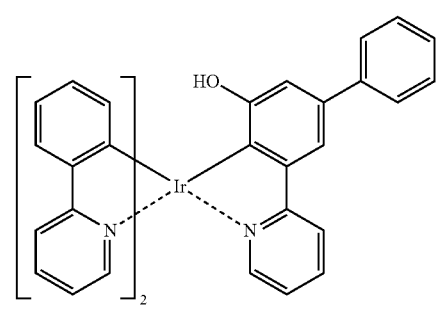

B-4-2
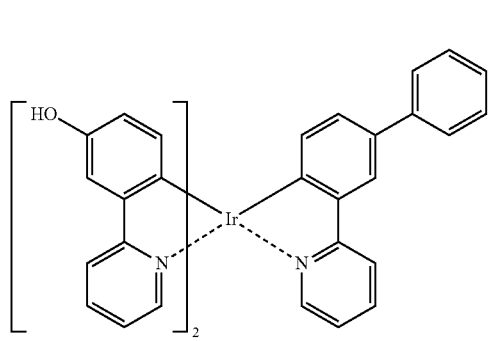
B-4-3
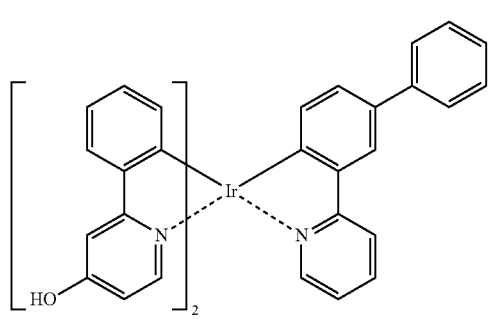
B-4-4
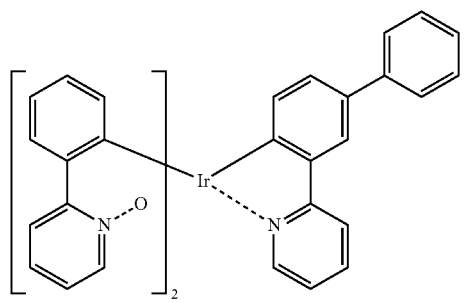
B-4-5
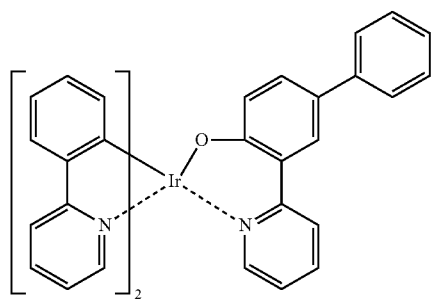
B-4-6
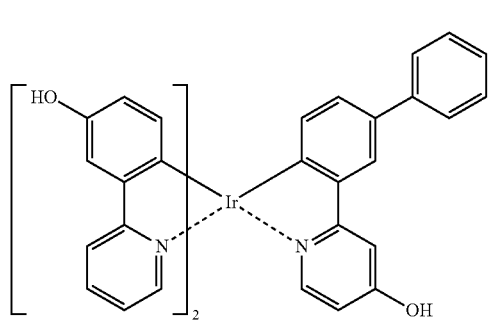
A-5
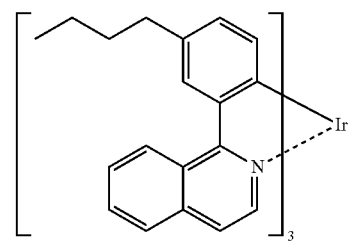
B-5-1
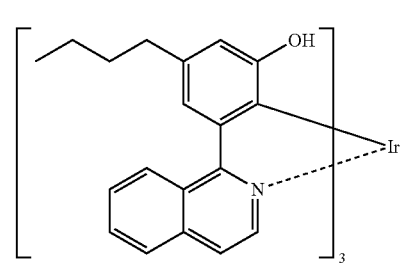
B-5-2
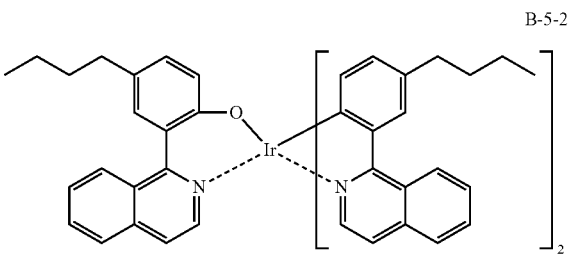
B-5-3
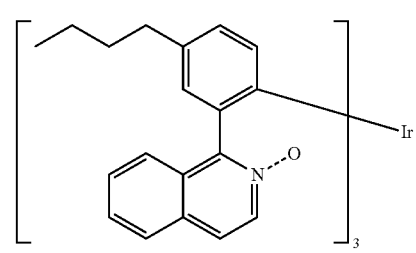
A-6
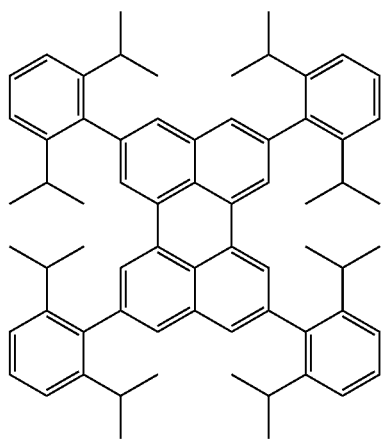

B-6-1
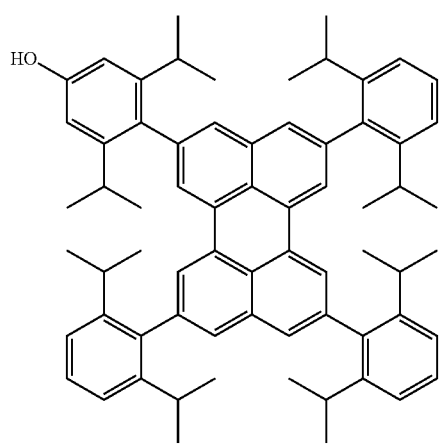
B-7-1
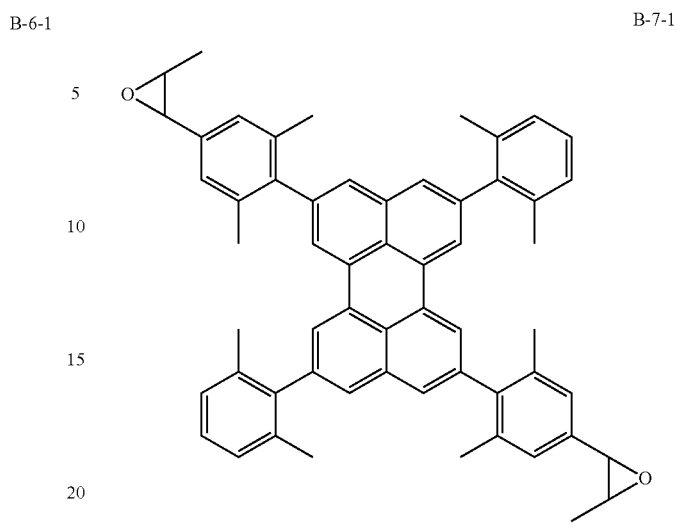
B-6-2
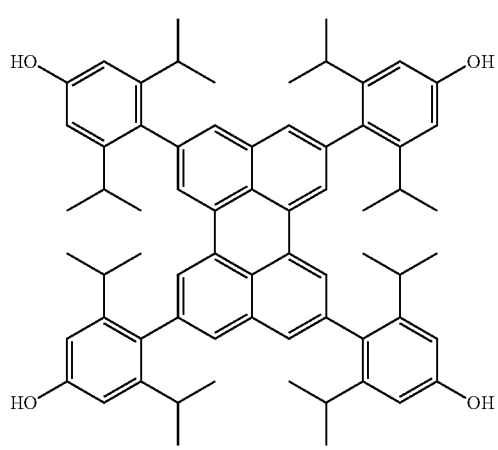
B-7-2
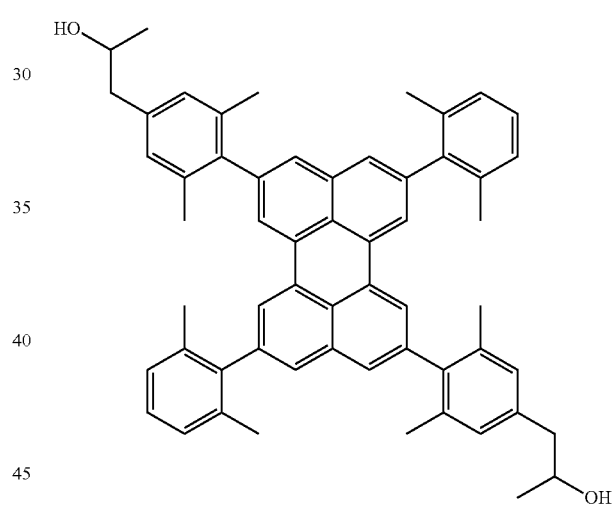
A-7
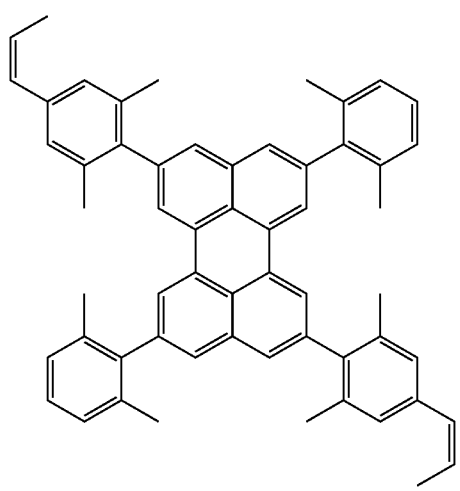
A-8
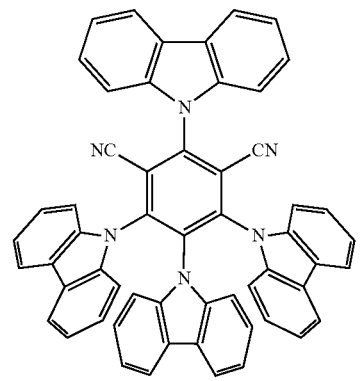

-continued

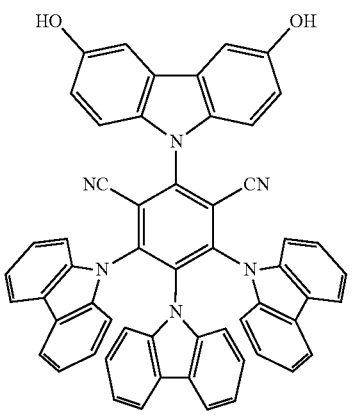
B-8-1

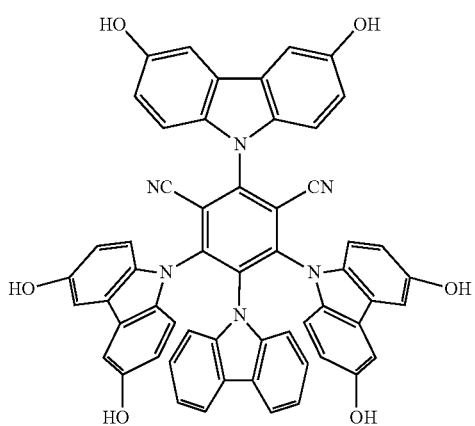
B-8-2

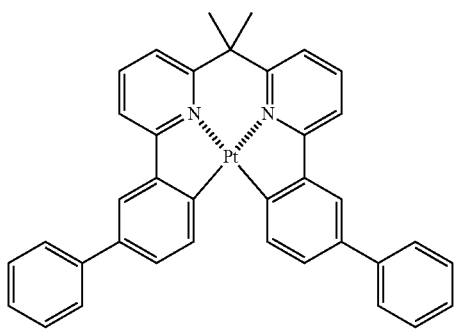
A-9

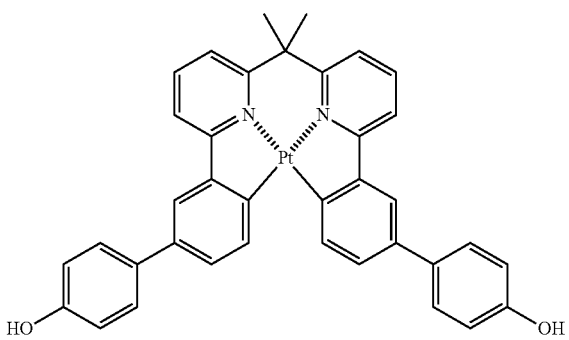
B-9-1

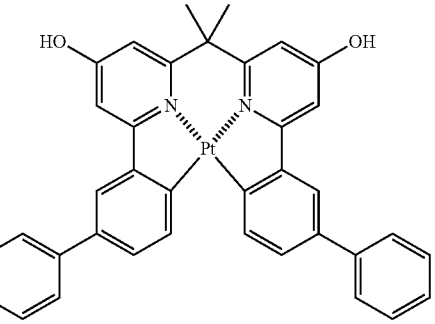
B-9-2

(1.3) Content of Luminescent Compound A and Oxide B

The concentration may be arbitrarily determined based on the specific luminescent compound used and the requirements of the electronic device to be applied, and the concentration may be uniform in the thickness direction of the light-emitting layer. It may also have an arbitrary concentration distribution.

The content is preferably in the range of 1 to 50 mass %, more preferably in the range of 1 to 30 mass %, when the entire luminescent thin film is 100 mass %

The number and form of the oxides B contained together with the luminescent material A in the luminescent thin film are not limited, and a plurality of oxides B may be contained. In this case, it is preferable that all the oxides B satisfy the above Equation (1).

The content of the oxide B is 0.0001 mass % or more with respect to the luminescent compound A.

It is preferable that the content of the oxide B is in the range of 0.001 to 100 mass % with respect to the luminescent compound A.

That is, in order to obtain the effect of the air stability of the present invention, the lower limit of the content of the oxide B is 0.0001 mass % or more, the content of 0.001 mass % or more is preferable, and the content of 0.01 mass % or more is still more preferable.

On the other hand, the upper limit of the content is preferably 100 mass % or less, and more preferably 10 mass % or less. Within this range, when used as an organic EL element, the amount of the oxide B increases, so that generation of carrier traps in the oxide B may be suppressed and reduction in luminous efficiency may be suppressed.

(1.4) Other Ingredient

The luminescent thin film of the present invention may contain other components within a range that does not inhibit the luminescence of the luminescent compound A, for example, it may contain a charge transport adjuvant such as a host compound, an electron accepting compound, or an electron donating compound, and it may contain a leveling agent, an antifoaming agent, a coating property improving agent such as a thickener, or a binder resin.

(1.4.1) Host Compound

As the host compound used in the present invention, a compound having a phosphorescence quantum yield of less than 0.1 at room temperature (25° C.) is preferable. More preferably, the phosphorescence quantum yield is less than 0.01. Among the compounds contained in the light-emitting layer, the mass ratio in the layer is preferably 20 mass % or more. The excited state energy of the host compound is preferably higher than the excited state energy of the luminescent dopant contained in the same layer.

As the host compound, a known host compound may be used alone or in combination of a plurality of kinds By using a plurality of host compounds, charge transfer may be adjusted, and the efficiency of the organic electroluminescent element may be increased.

Further, as the host compound used in the present invention, a conventionally known low molecular compound, a polymer compound having a repeating unit, or a low molecular compound having a polymerizable group such as a vinyl group or an epoxy group may be used. However, when a high molecular compound is used, a phenomenon that the compound is likely to take in the solvent and swell or gelled is likely to occur, so that the molecular weight is preferably not high in order to prevent this. Specifically, a compound having a molecular weight of 2000 or less at the time of application is preferably used, and a compound having a molecular weight of 1000 or less at the time of application is more preferably used.

As a known host compound, a compound which has a hole transporting ability and an electron transporting ability, and which prevents lengthening of light emission, and which has a high Tg (glass transition temperature) is preferable. Here, the glass transition point (Tg) is a value obtained by a method based on JIS-K-7121 using DSC (Differential Scanning calorimetry).

Specific examples of known host compounds include compounds described in the following documents. For example, JP-A 2001-257076, JP-A 2002-308855, JP-A 2001-313179, JP-A 2002-319491, JP-A 2002-334786, JP-A 2002-8860, JP-A 2002-334787, JP-A 2002-15871, JP-A 334788, JP-A 2002-43056, JP-A 334789, JP-A 2002-105455, JP-A 2002-348579 JP-A 2002-231453, JP-A 2003-3165, JP-A 2002-234888, JP-A 2003-27048, and JP-A 2002-255934, JP-A 2002-260861, JP-A 2002-299060, JP-A 2002-302516, JP-A 2002-305083, JP-A 2002-305084, JP-A 2002-308837, US 2003/0175553, US 2006/0280965, US 2005/0112407, US 2009/0017330, US 2005/0238919, WO 2001/039246, WO 2009/036247 WO 2005/089025, WO 2007/063796, WO 2007/063754, WO 2004/107822, WO 2005/030900, WO 2006/114966, WO 2009/086028, WO 2009/003898, WO 2012/023947, JP-A 2008-074939, JP-A 2007-254297, and EP2034538.

The host compound used in the present invention is preferably a carbazole derivative.

The content of the host compound is preferably in the range of 20 to 99 mass %, more preferably in the range of 50 to 99 mass %, when the luminescent thin film is 100 mass %

(1.5) Method for Manufacturing Luminescent Thin Film

The luminescent thin film of the present invention may be manufactured by preparing a luminescent compound A and an oxide B, respectively, and depositing the luminescent compound A and the oxide B on a base material by an arbitrary method such as an evaporation method or an application method.

As another manufacturing method, there is a manufacturing method in which only the luminescent compound A is prepared, and a part of the luminescent compound A is oxidized in the film formation process to be modified into the oxide B.

That is, the method for manufacturing a luminescent thin film of the present invention may employ a method for manufacturing a luminescent thin film characterized in that a step A for forming a first coating film on a base material in an atmospheric environment using a coating solution A, and a drying step other than atmospheric pressure heating and drying under an atmospheric environment after the step A.

Specifically, by forming a coating film under an atmospheric environment using the coating solution A containing the luminescent compound A, the luminescent compound A is partially modified into the oxide B, and the luminescent thin film of the present invention may be suitably manufactured. The rate of modification of the luminescent compound A to the oxide B varies depending on the type and concentration of the luminescent compound A, and may be arbitrarily changed depending on the oxidization property of the luminescent compound A to be used, the coating environment, and the drying conditions.

As a means for drying the luminescent thin film after formation of the undercoating film in the atmosphere, a generally used means for drying may be used, and there may be mentioned vacuum or pressure drying, heat drying, blow drying, IR drying, and drying by electromagnetic wave.

In the present invention, when the coating film is formed in an atmospheric environment and then heated and dried, it is preferable to heat and dry the coating film under reduced pressure. This is because, when the luminescent thin film is heated and dried in an atmospheric environment, oxide of the luminescent compound A proceeds excessively, by-products involved in quenching of the luminescent compound A are generated, and the luminescent intensity is lowered. When a drying process other than heating and drying is performed, the vacuum may be normal or reduced.

The temperature in the heating and drying is not particularly limited, but it is preferable that the temperature be equal to or higher than the boiling point of the solvent used for the coating liquid from the viewpoint of shortening the drying time. In the heating step, the heating time is not limited, but is preferably 10 seconds or more, usually 180 minutes or less. Examples of heating means include a clean oven, a hot plate, an infrared heater, a halogen heater, and a microwave irradiator. Among these, a clean oven and a hot plate are preferable in order to uniformly apply heat to the entire film.

The method of applying the coating solution A onto the base material is not particularly limited, and examples thereof include a spin coating method, a dip coating method, a die coating method, a bar coating method, a blade coating method, a roll coating method, a spray coating method, a capillary coating method, a nozzle printing method, an ink jet printing method, a screen printing method, a gravure printing method, a flexographic printing method, and an offset printing method.

The solvent used for the coating solution A is not particularly limited, and is preferably a solvent capable of dissolving the above-mentioned luminescent compound. The solvent used in the present invention may be an inorganic solvent or an organic solvent as long as the function of the luminescent compound is not deteriorated. The inorganic solvent and the organic solvent may be used alone or in a mixture of two or more kinds thereof.

Examples of the organic solvent used in the present invention include alcohols (methanol, ethanol, diol, triol, tetrafluoropropanol), glycols, cellosolves, ketones (acetone, methyl ethyl ketone), carboxylic acids (formic acid, acetic acid), carbonates (ethylene carbonate, propylene carbonate), esters (ethyl acetate, propyl acetate), amides (dimethyl sulfoxide), hydrocarbons (heptane), nitriles (acetonitrile), aromatic compounds (cyclohexylbenzene, toluene, xylene, chlorobenzene), alkyl halides (methylene chloride), amines (1,4-diazabicyclo [2.2.2] octane, diazabicycloundecene), and lactones.

Examples of the inorganic solvent used in the present invention include water ($H_2O$) and molten salts. Examples of the molten salt that may be used as inorganic solvents are: combinations of metal iodides such as lithium iodide, potassium iodide, cesium iodide, and calcium iodide and iodine; combinations of quaternary ammonium compounds such as tetraalkyl ammonium iodide, pyridinium iodide and imidazolium iodide and iodine; combinations of metal bromides such as lithium bromide, potassium bromide, cesium bromide, and calcium bromide and bromine; combinations of quaternary ammonium bromide compound such as tetraarkyammonium bromide and pyridinium bromide and bromine; metal complexes such as ferrocyanate-ferricyanate, ferrocene-ferricinium ions; sulfur compounds such as sodium polysulfide, alkylthiol-alkyldisulfide; biologen dyes, and hydroquinone-quinone.

The type of the base material is not particularly limited, and may be transparent or opaque. When light is extracted from the support substrate side, it is preferable that the support substrate be transparent. Examples of the transparent support base material preferably used include glass, quartz, and a transparent resin film. Here, "transparent" means that the light transmittance in the visible light region is preferably 60% or more, more preferably 80% or more.

Examples of a resin film are films formed with resins such as: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyallylates and cycloolefin resins such as ARTON (trade name, made by JSR Co. Ltd.) and APEL (trade name, made by Mitsui Chemicals, Inc.).

An inorganic or organic coating or a hybrid coating of both may be formed on the surface of the resin film as a gas barrier layer. Such a gas barrier layer is provided for the purpose of suppressing penetration of moisture or oxygen which causes deterioration of the element.

As a material for forming the gas barrier layer, a material having a function of suppressing penetration of moisture or oxygen which causes deterioration of the element may be used. For examples, silicon oxide, silicon dioxide, or silicon nitride may be used. Further, in order to improve the fragility of the film, it is more preferable to have a laminated structure of these inorganic layers and layers made of an organic material. The stacking order of the inorganic layer and the organic layer is not particularly limited, but it is preferable that both layers are alternately stacked a plurality of times.

The method of forming the gas barrier layer is not particularly limited. For example, a vacuum evaporation method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, or a coating method may be used. However, an atmospheric pressure plasma polymerization method as described in JP-A 2004-68143 is particularly preferable.

It is preferable that the resin film has a gas barrier layer having a water vapor permeability of $1\times10^{-3}$ $g/m^2 \cdot 24$ h at a temperature of $25\pm0.5°$ C. in a relative humidity of $90\pm2\%$ RH measured with a method based on JIS K 7129-1992. Further, it is preferable that the barrier layer has an oxygen permeability of $1\times10^{-3}$ $mL/m^2 \cdot 24$ hr·atom (1 atom is $1.01325\times10^5$ Pa.) or less measured with a method based on JIS K 7126-1987, and a water vapor permeability of $1\times10^{-3}$ $g/m^2 \cdot 24$ h at a temperature of $25\pm0.5°$ C. in a relative humidity of $90\pm2\%$ RH.

Examples of the opaque support substrate include a metal plate such as aluminum or stainless steel, a film, an opaque resin substrate, and a ceramic substrate.

(2) Luminescent Multilayer Film
(2.1) Configuration of Luminescent Multilayer Film The luminescent thin film of the present invention may further improve the atmospheric stability by forming a luminescent multilayer film in which an arbitrary compound is contained in an upper layer. This is because the upper layer functions as a protective layer by forming the luminescent multilayer film, and entry of air into the luminescent film may be suppressed.

FIG. 4 illustrates an example of a luminescent multilayer film formed by the method for manufacturing a luminescent multilayer film of the present invention.

In a multilayer film 10 before the drying step, for example, a base material 20, a first coating film 30, and a second coating film 40 are laminated in this order. Here, the first coating film 30 and the second coating film 40 become a first layer 31 and a second layer 41 through a drying process. Since the first layer 31 contains a luminescent material, it is a light-emitting layer having a light emitting function.

Further, the present invention is not limited to the example shown in FIG. 4, and the layer configuration of the multilayer film may be changed within a range in which the effect of the present invention may be obtained. For example, after the second coating film is formed, a new third coating film may be further formed on the second coating film. The third coating film is not particularly limited to a material contained therein or a lamination method. The method of laminating the third coating film may be an evaporation method or an application method, but similarly to the second coating film, it is preferable to form the third coating film by an application method in an atmospheric environment from the viewpoint of easiness of the process.

The drying step C after the formation of the second coating film according to the present invention may be performed one or more times after the formation of the second coating film. For example, when the third coating film is formed by the coating method after the formation of the second coating film, the drying step C may be performed only once after the formation of the third coating film, or the drying step C may be performed after the formation of the second coating film, and the drying step may be performed again after the formation of the third coating film.

Although an example in which the third coating film is formed on the second coating film has been described, the present invention is not limited to this, and a plurality of coating films may be further formed.

Further, although it is preferable to perform the step B of forming the second coating film immediately after the step A of forming the first coating film, a drying process other than the atmospheric pressure heating drying may be performed between the step A and the step B within a range that does not hinder the effect of the present invention. When the drying process is heat drying, heat drying under reduced pressure is preferred.

Hereinafter, the constitutional requirements of the manufacturing method of the luminescent multilayer film of the present invention will be described in detail.

(2.2) Manufacturing Method of Luminescent Multilayer Film (2.2.1) Configuration of Luminescent Multilayer Film The structure of the luminescent multilayer film is a luminescent multilayer film comprising a first layer and a second layer in this order, wherein the first layer contains at least one luminescent compound A and an oxide B of the luminescent compound A.

Figure 5:
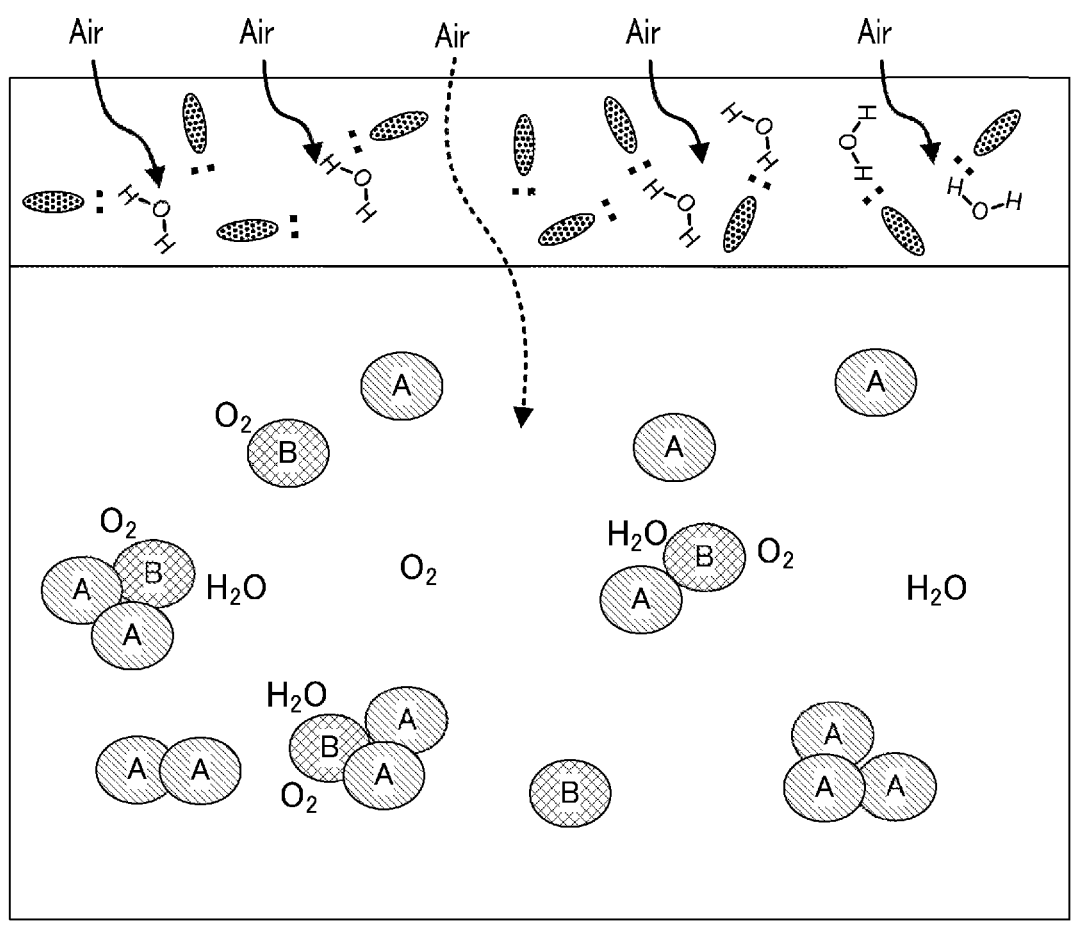
FIG. 5 is a multilayer film in which a protective layer containing a compound having a lone electron pair is laminated on an upper layer of a luminescent thin film.

The second layer preferably contains a compound containing a lone electron pair. This is because, as shown in FIG. 5, by forming a multilayer film in which a compound having a lone electron pair (a portion indicated by an ellipse in the drawing) is contained in the upper layer of the luminescent thin film, moisture (denoted by H—O—H in the drawing) in the atmosphere that has entered from the upper layer is trapped by hydrogen bonding with the lone electron pair, and the absolute quantity of moisture in the atmosphere that has entered the luminescent layer may be reduced.

More preferably, the compound containing the lone electron pair is a nitrogen-containing compound. This is because by using the lone electron pair of a nitrogen atom, the Lewis basicity may be enhanced, moisture may be more efficiently trapped, and entry into the light-emitting layer may be suppressed.

Figure 6:
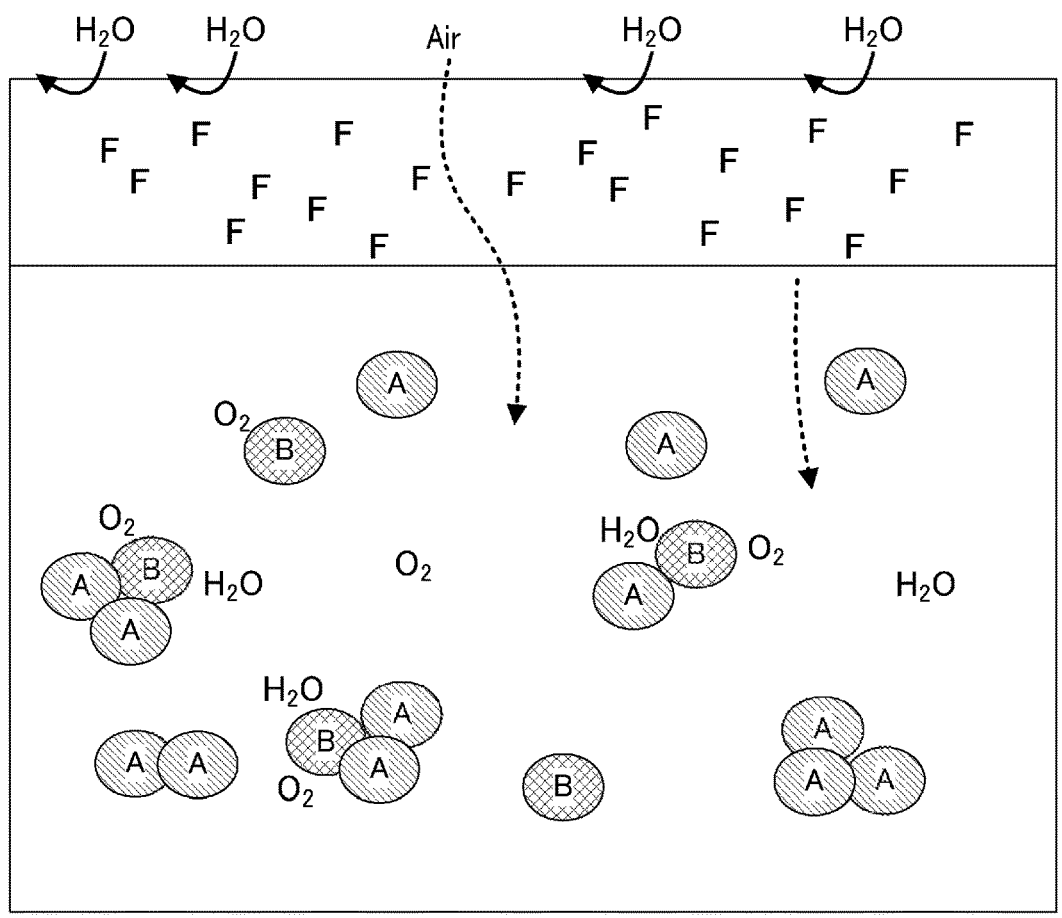
FIG. 6 is a multilayer film in which a protective layer containing a fluorine compound is laminated on an upper layer of a luminescent thin film.

In another embodiment, it is preferable that the second layer contains a fluorine compound. This is because, as shown in FIG. 6, by forming a multilayer film in which a fluorine compound (denoted as F in the drawing) is contained in the upper layer of the luminescent thin film of the present invention, entry of moisture in the atmosphere that has entered from the upper layer is suppressed by water repellency of fluorine, and the absolute amount of moisture that has entered the light-emitting layer may be reduced.

More preferably, the fluorine compound is a fluorine solvent at normal temperature and normal pressure. This is because the liquid may be uniformly distributed in the upper layer, and the luminescent thin film of the lower layer may be entirely water-repellent and protected. There is no particular limitation on the fluorine solvent as long as it has a fluorine atom in its structure.

Examples include fluorine-containing hydrocarbons, fluorine-containing alcohols, fluorine-containing aromatic compounds, fluorine-containing ethers, fluorine-containing ketones, fluorine-containing esters, fluorine-containing amides, and fluorine-containing carboxylic acids.

Among these, in the present invention, it is preferable to use a fluorine-containing alcohol from the viewpoint of obtaining an element of high light emission efficiency driven with low voltage.

As one of preferable fluorine-containing alcohols, the compounds represented by the following Formula (1), Formula (2), or Formula (3) may be cited.

 Formula (1):

In Formula (1), A represents $CF_3$ or $CHF_2(CF_2)_n$, where n is an integer of 1 to 5. More preferably, n is an integer of 1 to 3, more preferably n is 1. Specific examples of the fluorine-containing alcohol include, for example, the following compounds.

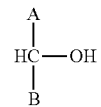 Formula (2)

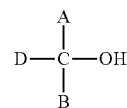 Formula (3)

In Formulas (2) and (3), A, B, and D represent $CH_{3-x}F_x$ or $CH_{3-x}F_x(CH_{2-y}F_y)_n$ independently, where x represents 1 to 3, y represents 1 to 2, and n represents 0 to 1.

Specific examples of these fluoroalcohols include the following compounds:
2,2,3,3-Tetrafluoropropanol,
2,2,3,3,3-Pentafluoropropanol,
2-Triforomethyl-2-propanol,
2,2,3,3,4,4-Hexafluorobutanol,
2,2,3,3,4,4,5,5-Octafluoropentanol,
1,1,1,3,3,3-Hexafluoro-2-propanol,
2,2,2-Trifluoro-1-ethanol,
2,3-Difluorobenzyl alcohol,
2,2,2-Trifluoroethanol,
1,3-Difluoro-2-propanol,
1,1,1-Trifluoro-2-propanol,
3,3,3-Trifluoro-1-propanol,
2,2,3,3,4,4,4-Heptafluoro-1-butanol,
2,2,3,3,4,4,5,5-Octafluoro-1-pentanol,
3,3,4,4,5,5,5-Heptafluoro-2-pentanol,
2,2,3,3,4,4,5,5,6,6,7,7,8,8,8-Ppentadecafluoro-1-octanol,
3,3,4,4,5,5,6,6,7,7,8,8,8-Tridecafluoro-1-octanol,
1H,1H,9H-Perfluoro-1-nonanol,
1H,1H,2H,3H,3H-Perfluorononane-1,2-diol,
1H,1H,2H,2H-Perfluoro-1-decanol,
1H,1H,2H,3H,3H-Perfluoroundecan-1,2-diol.

Fluorine containing propanol is further preferred, and 2,2,3,3-tetrafluoro-2-propanol, 1,1,1,3,3,3-hexafluoro-2-propanol, or 2,2,3,3,3-pentafluoropropanol is further preferred.

These fluorine-containing solvents used in the present invention are preferably distilled.

Further, it is preferable that the fluorine solvent content is in the range of 0.01 to 10 mass % in the second layer. When the content is 0.01 mass % or more, the water repellent effect by the fluorine solvent is maintained, and when the content is 10 mass % or less, the element does not cause a voltage rise due to carrier transport inhibition by the residual solvent at the time of energization.

(2.2.2) Manufacturing Method of Luminescent Multilayer Film

The luminescent multilayer film of the present invention may be manufactured by preparing each of the above-mentioned materials and forming a multilayer film by an arbitrary method such as a vapor deposition method or a coating method.

As another manufacturing method, there is a manufacturing method in which only the luminescent compound A is prepared, and a part of the luminescent compound A is oxidized in the film formation process to be modified to the oxide B. Specifically, the first coating film may be formed in an atmospheric environment using a coating solution containing the luminescent compound A, and then the second layer may be laminated by an optional drying method or a lamination method. The rate of modification of the luminescent compound A to the oxide B varies depending on the type and concentration of the luminescent compound A, and may be arbitrarily changed depending on the oxidization property of the luminescent compound A to be used, the coating environment, and the drying conditions.

Preferably, the following method may be cited for the present invention: a method for manufacturing a luminescent multilayer film comprising: a step A of forming a first coating film on a base material in an atmospheric environment using the coating solution A; a step B of forming a second coating film on the first coating film using a coating solution B different from the coating solution A in an atmospheric environment through a drying step other than atmospheric pressure heating and drying in an atmospheric environment after the step A; and a step C of drying in an atmospheric environment after the step B in this order.

When the first layer is heated and dried in an atmospheric environment, oxidation of the luminescent compound A excessively proceeds, by-products involved in quenching of the light-emitting compound A are generated, and a decrease in luminescence intensity is caused. Therefore, it is preferable that the first layer has a drying step other than normal pressure heating and drying in the above-mentioned atmospheric environment.

Another preferable manufacturing method is a manufacturing method of a multilayer film formed by a step A of forming a first coating film on a base material using a coating solution A containing a luminescent compound A in an atmospheric environment, a step B of forming a second coating film on the first coating film in an atmospheric environment using a coating solution B different from the coating solution A, and a step C of drying in an atmospheric environment after the step B. In this method of manufacturing a luminescent film, since the first coating film and the second coating film are continuously coated and laminated in an atmospheric environment and then dried in the atmosphere collectively, the first coating film is dried in a state protected by the second coating film during drying. By this drying method, since the atmosphere is dried in a state where it does not come into contact with the first coating film, it is possible to suppress excessive oxidation of the luminescent compound A and suppress generation of decomposition products involved in quenching of the luminescent compound A. In other words, the oxide B is generated while maintaining the luminescence of the first coating film, whereby a luminescence multilayer film having excellent atmospheric stability may be suitably produced.

In particular, it is preferable that the coating solution B contains the fluorine solvent. This is because the first coating film is dried in a state of being protected by the second coating film containing the fluorine solvent, so that the formation of decomposition products derived from the luminescent compound A may be further suppressed.

<Preparation of Coating Solution>

The environment in which the coating solution A and the coating solution B are prepared is not particularly limited, but it is preferable from the viewpoint of the production process efficiency that the environment is an atmospheric environment as in the step of forming the coating film.

<Formation of Coating Film>

The coating method of the coating solution A for forming the first coating film and the coating solution B for forming the second coating film according to the present invention is not particularly limited, and examples thereof include a spin coating method, a dip coating method, a die coating method, a bar coating method, a blade coating method, a roll coating method, a spray coating method, a capillary coating method, a nozzle printing method, an inkjet printing method, a screen printing method, a gravure printing method, a flexographic printing method, and an offset printing method.

Among these, when the inkjet printing method is applied, the effect of the present invention may be effectively obtained, which is preferable. When the inkjet printing method is carried out, a solvent having a high viscosity is usually preferred, so that the coating liquid tends to have a high boiling point. Therefore, it is required to lengthen the time of the drying process of the coating film or increase the drying temperature, and when the drying process is performed in a known atmosphere environment, the function of the film tends to be deteriorated. However, when the method for manufacturing the luminescent multilayer film of the present invention is used, the deterioration of the function of the film may be suppressed even when the drying step is performed in a known atmosphere environment, so that the inkjet printing method may be suitably used.

In addition, when the inkjet printing method is applied, manufacturing under atmospheric pressure is required, and the surface area in contact with the outside air is increased by ejecting droplets under atmospheric pressure, so that the ink jet printing method is more susceptible to the influence of moisture and oxygen as compared with other coating methods. Therefore, in the inkjet printing method, it is desirable to reduce the adverse effect of oxygen and moisture in the atmosphere. However, with respect to the problem of reducing the adverse effects of the oxygen and water in the inkjet printing method, the use of the method for producing a luminescent multilayer film of the present invention suppresses reduction of the film function even when produced in a known atmospheric environment. Since the problem can be suppressed, the problem may be solved by combining the luminescent thin film of the present invention.

(Atmospheric Environment)

In the present invention embodiment, the "atmospheric environment" in which the coating solution A and the coating solution B are applied refers to an oxygen-containing gas atmosphere. For example, it is a gas atmosphere in which the ratio of gas is 78 volume % of nitrogen ($N_2$), 21 volume % of oxygen ($O_2$), and 0 volume % to 4 volume % of water ($H_2O$).

(Temperature)

The temperatures at the time of applying the coating solutions A and B are temperatures at which crystals do not easily occur in the coating solution, and are not limited as long as the effect of the present invention is not significantly impaired. It is preferably in the range of 10 to 50° C., more preferably in the range of 13 to 40° C., and still more preferably in the range of 16 to 30° C.

(Humidity)

The relative humidity at the time of applying the coating solution A and the coating solution B is not limited as long as the effect of the present invention is not significantly impaired, but the lower limit is usually 0.01 ppm or more, preferably 0.05 ppm or more, more preferably 0.1 ppm or more. The upper limit of the relative humidity is usually 80% or less, preferably 60% or less, still more preferably 15% or less, further more preferably 1% or less, and particularly preferably 100 ppm or less. It is preferable to be within the above range because the film forming conditions in the wet film forming method may be easily controlled and moisture adsorption to the organic layer is difficult.

(Pressure)

The pressure in the coating process of coating solution A and coating solution B is usually in the range of 90000 to 110000 Pa, preferably in the range of 95000 to 105000 Pa. The above range is preferable in that a large area may be easily applied because it is within a general atmospheric pressure range.

(Lighting)

The light at the time of application in an atmospheric environment is not particularly limited, but it is preferable that the material contained in the application liquid has a wavelength which does not have absorption. For example, yellow light may be used.

<Drying Process (Step C)>

(Drying Method)

The term "drying" in the present invention means that, when the solvent content of the first coating film and the second coating film after step A and step B is 100%, the solvent content is reduced to 10% or less, and more preferably, it is reduced to 1% or less.

In the drying process in an atmospheric environment in the present invention, a generally used drying means may be used, and heating drying, blowing drying, IR drying, drying by electromagnetic waves, and the like may be cited. Among these, heat drying is preferable from the viewpoint of easiness of the process.

(Heat Drying)

The temperature in the heating and drying is not particularly limited, but it is preferable that the temperature be equal to or higher than the boiling point of the solvent used for the coating liquid from the viewpoint of shortening the drying time. In the heating step, the heating time is not limited, but it is preferably 10 seconds or more, usually 180 minutes or less. Examples of heating means include a clean oven, a hot plate, an infrared heater, a halogen heater, and a microwave irradiator. Among these, a clean oven and a hot plate are preferable in order to uniformly apply heat to the entire film.

Furthermore, it is preferable to hold the Tg of the material contained in the multilayer film at a temperature lower than that of the material having the lowest Tg (Tg+20° C.).

(Solvent Used for Coating Solution B)

The solvent used for the coating solution B is not particularly limited as in the case of the coating solution A, and it is preferably a solvent capable of dissolving the necessary material. Further, in order to suppress mixing with the coating solution A, it is preferable that the solvent of the coating solution A and the solvent of the coating solution B are incompatible with each other.

It is further preferable that the coating solution B contains the fluorine solvent. This is because the first coating film is dried in a state of being protected by the second coating film containing the fluorine solvent, so that the generation of decomposition products derived from the luminescent material A may be further suppressed.

(2.3) Applications of Luminescent Multilayer Film

The multilayer film produced by the method for producing a luminescent multilayer film of the present invention is applicable to multilayer films used in various products, and it may be applied to various electronic devices such as organic electroluminescence elements and organic thin film solar cells, for example.

Hereinafter, an organic electroluminescence element (hereinafter referred to as an organic EL element) to which a multilayer film formed by the method of manufacturing a luminescent multilayer film of the present invention may be suitably applied will be described.

The organic EL element of the present invention has an anode and a cathode on a base material, and an organic constituent layer including a light-emitting layer is sandwiched between the anode and the cathode. Further, a sealing layer, a barrier layer, or a light extraction layer may be appropriately combined to form a structure.

Typical organic constituent layers in the organic EL element of the present invention include, but are not limited to, the following structures.

(2.3.1) Organic EL Element

Figure 7:
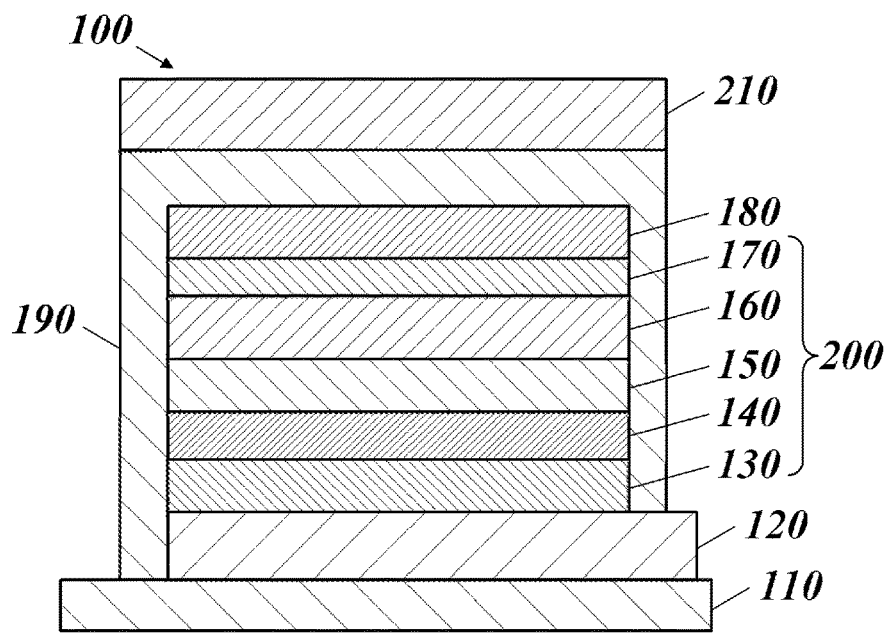
FIG. 7 is a schematic diagram illustrating an example of a layer configuration of an organic electroluminescent element.

As illustrated in FIG. 7, for example, an organic EL element 100 includes a flexible support substrate 110. An anode 120 is formed on the flexible support substrate 110, an organic functional layer 200 is formed on the anode 120, and a cathode 180 is formed on the organic functional layer 200.

The organic functional layer 200 refers to each layer constituting the organic EL element 100 provided between the anode 120 and the cathode 180.

The organic functional layer 200 includes, for example, a hole injection layer 130, a hole transport layer 140, a light-emitting layer 150, an electron transport layer 160, and an electron injection layer 170, and may include a hole blocking layer and an electron blocking layer.

The anode 120, the organic functional layer 200, and the cathode 180 on the flexible support substrate 110 are sealed by a flexible sealing member 210 through a sealing adhesive 190.

When the method for manufacturing a luminescent multilayer film of the present invention is applied to a method for manufacturing an organic EL element, it can be used, for example, in forming a multilayer film of the light-emitting layer 150 and the electron transport layer 160 on the flexible support substrate 110.

Specifically, for example, the layer obtained by drying the first coating film formed by the coating solution A becomes the light-emitting layer 150, and the layer obtained by drying the second coating film formed by the coating solution B becomes the electron transport layer 160. The light emitting layer 150 and the electron transport layer 160 may be formed by the method for producing a luminescent multilayer film of the present invention.

In addition, the present invention is not limited to this, and when a plurality of layers including the light-emitting layer 150 are formed within the range in which the effect of the present invention may be obtained, a stacked film used for an organic EL element may be formed by using the manufacturing method of the luminescent multilayer film of the present invention.

The layer structure of the organic EL element 100 shown in FIG. 7 is merely a preferable specific example, and may have, for example, the following layer structures (i) to (viii).

(i) Flexible support substrate/anode/light-emitting layer/electron transport layer/cathode/thermal conductive layer/sealing adhesive/sealing member (ii) Flexible support substrate/anode/hole transport layer/light-emitting layer/electron transport layer/cathode/thermal conductive layer/sealing adhesive/sealing member (iii) Flexible support substrate/anode/hole transport layer/light-emitting layer/hole blocking layer/electron transport layer/cathode/thermal conductive layer/sealing adhesive/sealing member (iv) Flexible support substrate/anode/hole transport layer/light-emitting layer/hole blocking layer/electron transport layer/cathode buffer layer/cathode/thermal conductive layer/sealing adhesive/sealing member (v) Flexible support substrate/anode/anode buffer layer/hole transport layer/light-emitting layer/hole blocking layer/electron transport layer/cathode buffer layer/cathode/thermal conductive layer/sealing adhesive/sealing member
(vi) Glass support/anode/hole injection layer/light-emitting layer/electron injection layer/cathode/sealing member
(vii) Glass support/anode/hole injection layer/hole transport layer/light-emitting layer/electron injection layer/cathode/sealing member
(viii) Glass support/anode/hole injection layer/hole transport layer/light-emitting layer/electron transport layer/electron injection layer/cathode/sealing member With respect to the organic EL element of the present invention, there are no particular limitations on the respective configurations, manufacturing methods, and applications other than the configurations described above in detail, and known configurations, materials, and manufacturing methods may be applied. For example, it may be manufactured with reference to WO 2012/077431, JP-A. 2013-089608, JP-A. 2014-120334, and JP-A 2015-201508.

In the present invention, it is preferable that at least one of the electrodes (anode and cathode) is an electrode having a work function of 4.2 eV or more, and it is preferable to use silver, gold, or cobalt from the viewpoint of obtaining an organic EL element having a longer life. This is presumed to be effective in improving the driving stability of the organic EL element by improving the atmospheric stability of the electrode.

Organic EL elements may be used as lighting devices, displays, and various light-emitting light sources.

Further, as the light emission source, for example, home lighting, vehicle interior lighting, backlight for watches and liquid crystals, billboard advertisement, traffic light, light source of optical storage medium, light source of electrophotographic copying machine, light source of optical communication processor, optical sensor, and a wide range of applications such as general household electric appliances that require a display device are cited. In particular, it can be effectively used as a backlight of a liquid crystal display device combined with a color filter or a light source for illumination.

EXAMPLES

Hereinafter, the present invention will be described in detail with reference to examples, but the present invention is not limited thereto. In the examples, "parts" or "%" are used, but unless otherwise specified, "mass %" is indicated.

The compounds used in the examples are shown below.

H-1
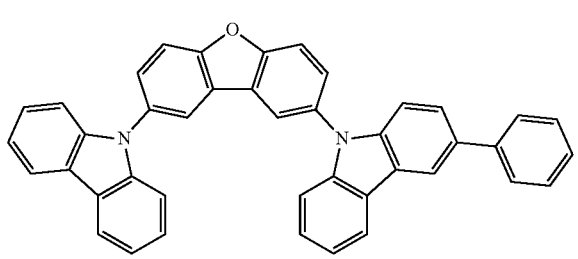

H-2
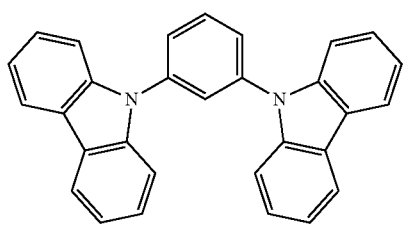

-continued

H-3
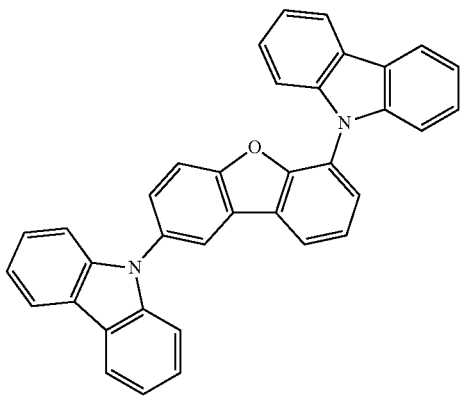

H-4
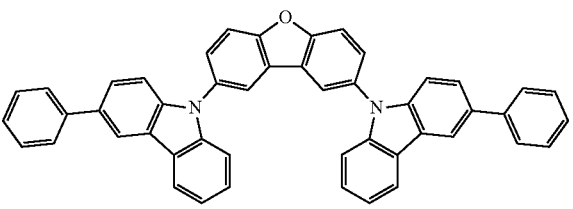

H-5
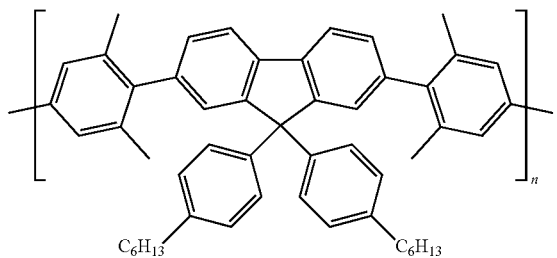

C-1
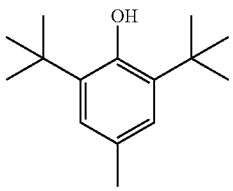

C-2
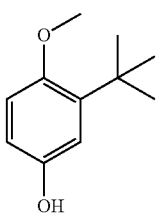

C-3
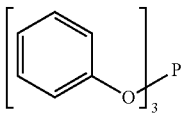

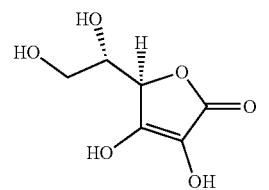
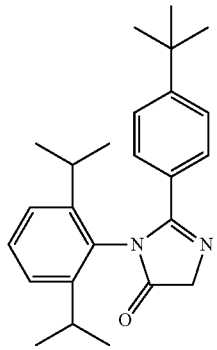
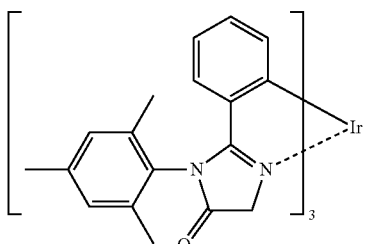 C-6
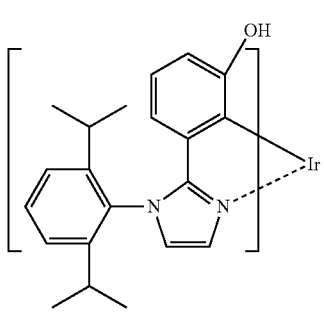 C-7
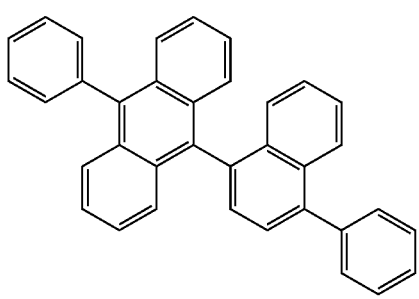 PT-1
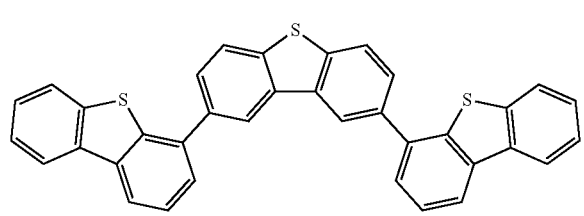 PT-2
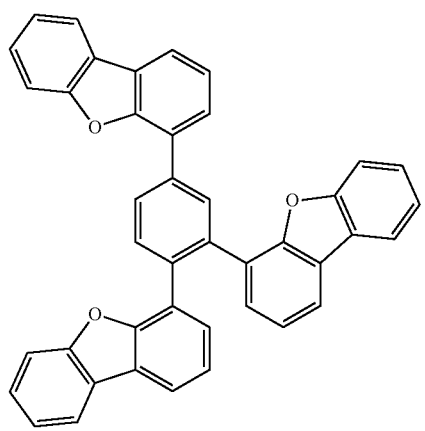 PT-3
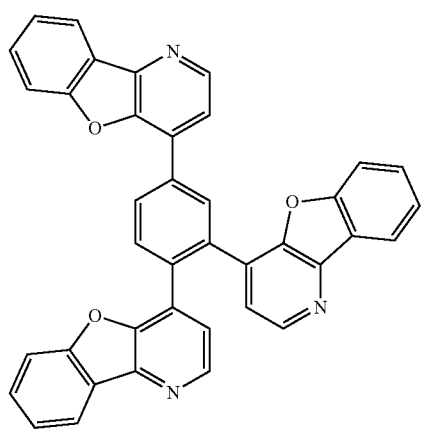 PT-4
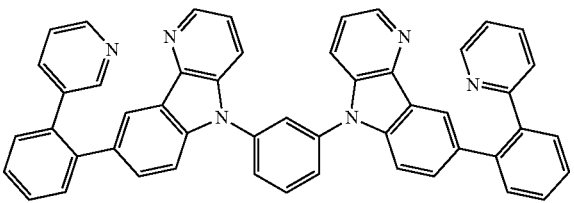 PT-5
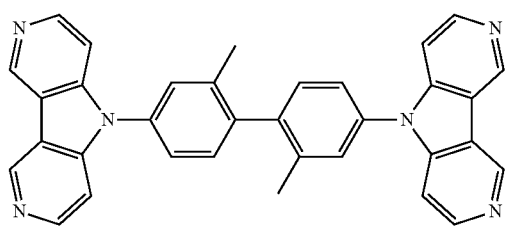 PT-6
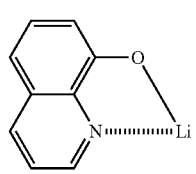 PT-7

-continued

PT-8
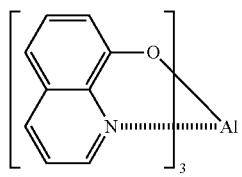

PT-9
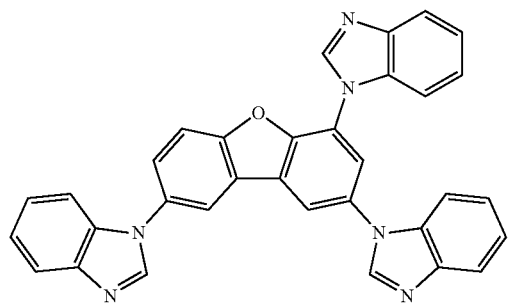

PT-10
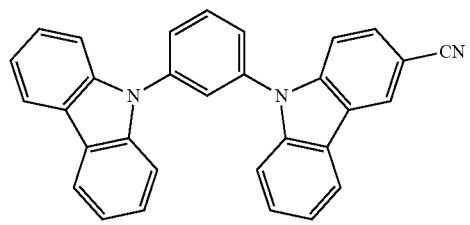

PT-11
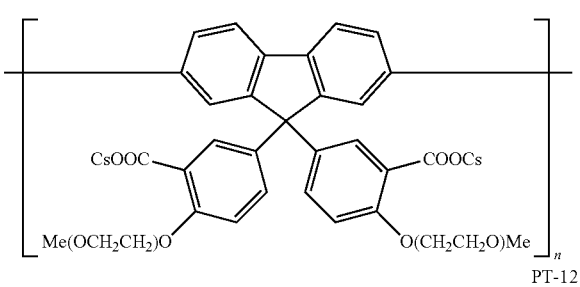

PT-12
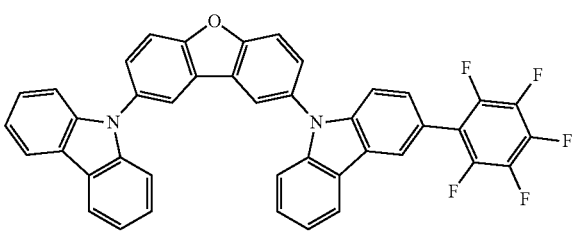

PT-13
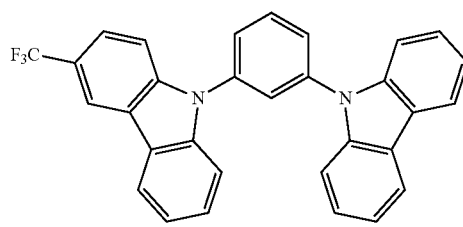

-continued

HT-1
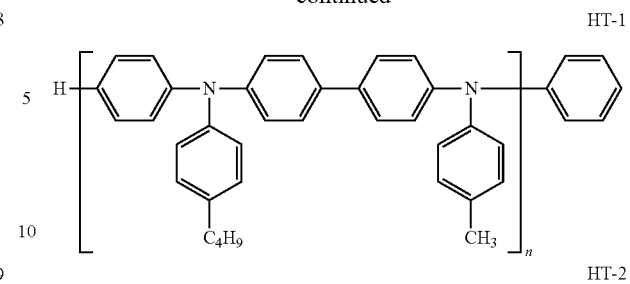

HT-2
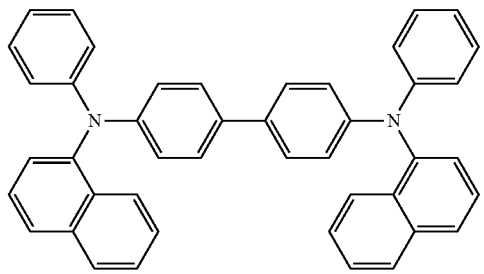

Example 1

In Example 1, the luminescent thin film of the present invention was formed, and the change in luminescence intensity when stored in an atmospheric environment was evaluated.

<Formation of Evaluation Single Film 1-1>

A quartz substrate having a length of 50 mm, a width of 50 mm, and a thickness of 0.7 mm was ultrasonically cleaned with isopropyl alcohol, dried with dry nitrogen gas, and UV ozone cleaning was performed for 5 minutes.

Under a nitrogen atmosphere, the host compound H-1 and the exemplary luminescent compound A-1 (H-1/A-1=80 mass %/20 mass %) were dissolved in normal butyl acetate at a concentration of 1 mass %. Using the obtained normal butyl acetate solution, a film with a thickness of 50 nm was formed on a quartz substrate by a spin coating method, and the film was dried at 120° C. for 30 minutes in a nitrogen gas atmosphere to form an evaluation single film 1-1.

<Formation of Evaluation Single Films 1-2 to 1-18>

In forming the evaluation single film 1-1, an evaluation single film 1-2 was formed in the same manner except that a part of the host compound H-1 was replaced with the oxide C-1 (H-1/A-1/C-1=70 mass %/20 mass %/10 mass %). In the table, "oxide" is denoted as "antioxidant".

Further, in the formation of the evaluation single film 1-2, the evaluation single films 1-3 to 1-18 were produced in the same manner except that the oxide C-1 was replaced with the oxide described in Table 1.

<Evaluation of Atmospheric Storage Stability of Evaluation Single Film>

The emission spectrum was measured according to the following measurement method, and the emission intensity of each evaluation single film was evaluated.

Immediately after each evaluation single film was carried out in an atmospheric environment, light having an excitation wavelength of 300 nm was irradiated to measure an emission spectrum and an emission intensity in a room temperature state (23° C., 55% RH). Here, the emission spectrum was measured using F-7000 manufactured by Hitachi High-Technologies, Ltd. After the measurement, the sample was stored in a light-shielded state, an atmospheric environment, and a room temperature state for 24 hours, and the luminescence intensity was measured again. Using the luminescence intensity before and after storage for 24 hours in an atmospheric environment, the luminescence residual rate after storage (=luminescence intensity after storage in the atmosphere for 24 hours/luminescence intensity immediately after carried out) was calculated.

Here, the ratio of the luminescence remaining ratio of each evaluation single film when the evaluation single film 1-1 was set to a relative value of 1.00 was calculated as a relative value. The larger the value is more than 1.00, the higher the luminescence remaining ratio at the time of storage in an atmospheric environment and the better the atmospheric storage stability.

TABLE I

| Evaluation single film | Antioxidant | Evaluation Relative value of luminescence remaining ratio | Remarks |
|---|---|---|---|
| 1-1 | None | 1.00 | Comparative example |
| 1-2 | C-1 | 1.09 | Comparative example |
| 1-3 | C-2 | 1.02 | Comparative example |
| 1-4 | C-3 | 0.97 | Comparative example |
| 1-5 | C-4 | 1.10 | Comparative example |
| 1-6 | C-5 | 1.19 | Comparative example |
| 1-7 | C-6 | 1.03 | Comparative example |
| 1-8 | C-7 | 0.99 | Comparative example |
| 1-9 | B-1-8 | 1.40 | Present invention |
| 1-10 | B-1-9 | 1.33 | Present invention |
| 1-11 | B-1-1 | 1.67 | Present invention |
| 1-12 | B-1-4 | 1.71 | Present invention |
| 1-13 | B-1-5 | 1.65 | Present invention |
| 1-14 | B-1-6 | 1.81 | Present invention |
| 1-15 | B-1-7 | 1.64 | Present invention |
| 1-16 | B-1-11 | 1.72 | Present invention |
| 1-17 | B-1-12 | 1.81 | Present invention |
| 1-18 | B-1-15 | 1.66 | Present invention |

As shown in Table I, it was found that the thin films 1-9 to 1-18 containing the oxide B according to the present invention are luminescent thin films having excellent atmospheric storage stability. In addition, in C-5 to C-7 in which ligands and partial structures of the oxide B-1-1 and B-1-5 according to the present invention are changed, the effect of improving the atmospheric storage stability is not observed. Therefore, it is understood that the oxide B of the luminescent material A according to the present invention is required in the present invention. Further, it is understood that the effect of stabilizing the storage of the atmosphere is more remarkable when the substituent of the oxide B has a hydroxy group, a phenolic hydroxy group, an epoxy group, or a carbonyl group.

Example 2

Subsequently, in Example 2, a single film in which the luminescent compound A and the oxide B according to the present invention were variously changed was produced, and the change in luminescence intensity when stored in an atmospheric environment was evaluated.

The quartz substrate was prepared in the same manner as in Example 1. Next, the quartz substrate was fixed to a substrate holder of a commercially available vacuum evaporation apparatus. Each of the resistance heating boats for deposition in the vacuum deposition apparatus was filled with an optimal amount for device fabrication. Resistance heating boats for deposition were made of molybdenum or tungsten.

<Formation of Evaluation Single Film 2-1>

After reducing the degree of vacuum to 1×10' Pa, the resistance heating boats each containing the host compound H-2, the luminescent compound A-6, and the oxide B-6-2 were energized and heated. The host compound, the light-emitting compound A-6, and the oxide B-6-2 were co-evaporated so as to be 88 volume %, 10 volume %, and 2 volume %, respectively, to form a 50 nm-thick luminescent film.

<Formation of Evaluation Single Films 2-2 to 2-6>

In forming the evaluation single film 2-1, evaluation single films 2-2 to 2-6 were formed in the same manner, except the luminescent compound A and the oxide B were changed as described in Table II.

<Evaluation of Atmospheric Storage Stability of Evaluation Single Film>

After carrying out each of the evaluation single films 2-1 to 2-6 from the vacuum evaporator to the atmospheric environment, the atmospheric storage stability was evaluated in the same manner as in Example 1. Here, when the evaluation single film 2-1 was set to a relative value of 1.00, the ratio of the luminescence remaining ratio of each evaluation single film was calculated as a relative value. The larger the value is more than 1.00, the higher the luminescence remaining ratio at the time of atmospheric storage and the better the atmospheric storage stability.

TABLE II

| Evaluation single film | Luminescent material | Antioxidant | Evaluation Relative value of luminescence remaining ratio | Remarks |
|---|---|---|---|---|
| 2-1 | A-6 | B-6-2 | 1.00 | Present invention |
| 2-2 | A-7 | B-7-2 | 1.09 | Present invention |
| 2-3 | A-8 | B-8-1 | 1.62 | Present invention |
| 2-4 | A-2 | B-2-4 | 1.79 | Present invention |
| 2-5 | A-1 | B-1-2 | 1.75 | Present invention |
| 2-6 | A-9 | B-9-2 | 1.67 | Present invention |

As shown in Table II, it was found that when a TADF material A-8 was used as a luminescent compound A, and A-1, A-2 and A-9 were used as phosphorescent materials, the effect of storage stability in air was large. It is presumed that this is because the TADF material or the phosphorescent material has a long emission life (τ) and is easily extinguished by the atmosphere, and therefore the effect of improving the air storage stability according to the present invention is more apparent.

Example 3

In Example 3, various luminescent thin films in which the ligand skeleton of the phosphorescent compound according to the present invention was changed were formed, and the change in luminescence intensity was evaluated when stored in an atmospheric environment.

<Formation of Evaluation Single Film 3-1>

A quartz substrate was prepared in the same manner as in Example 1. Host compound H-3, luminescent compound A-5, oxide B-5-1 (H-3A-5/B-5-1=80 mass %/15 mass %/5 mass %) were dissolved in normal butyl acetate at a concentration of 1.0 mass %. Using the obtained normal butyl acetate solution, a film with a thickness of 50 nm was formed on the quartz substrate by a spin coating method, and the film was dried at 120° C. for 30 minutes in a nitrogen gas atmosphere to form an evaluation single film 3-1.

<Formation of Evaluation Single Films 3-2 to 3-4>

In forming the evaluation single film 3-1, the evaluation single films 3-2 to 3-4 were produced in the same manner except that the combinations of the luminescent compound A-5 and the oxide B-5-1 were changed as described in Table 3.

<Evaluation of Atmospheric Storage Stability of Evaluation Single Film>

The produced evaluation single films 3-1 to 3-4 were evaluated for atmospheric storage stability in the same manner as in Example 1. Here, when the evaluation single film 3-1 was set to a relative value of 1.00, the ratio of the luminescence remaining ratio of each evaluation single film was calculated as a relative value. The larger the value is more than 1.00, the higher the luminescence remaining ratio at the time of atmospheric storage and the better the atmospheric storage stability.

TABLE III

| Evaluation single film | Luminescent material | Antioxidant | Evaluation Relative value of luminescence remaining ratio | Remarks |
| --- | --- | --- | --- | --- |
| 3-1 | A-5 | B-5-1 | 1.00 | Present invention |
| 3-2 | A-4 | B-4-1 | 1.11 | Present invention |
| 3-3 | A-3 | B-3-1 | 1.65 | Present invention |
| 3-4 | A-2 | B-2-5 | 1.81 | Present invention |

As shown in Table III, when the luminescent compound A was compared with a phosphorescent complex, it was found that when A-2 and A-3 having a 5-membered aromatic heterocyclic skeleton were used, the effect of stabilizing the storage of air according to the present invention was large. It is presumed that this is because the five-membered aromatic heterocyclic skeleton is liable to be oxidized and the atmospheric preservation is unstable, and therefore the effect of the atmospheric preservation stabilization according to the present invention becomes more obvious.

Example 4

In Example 4, in the luminescent multilayer film in which the second layer was provided on the luminescent thin film according to the present invention, the atmospheric storage stability was evaluated when the material in the second layer was changed variously.

<Formation of Evaluation Single Film 4-1>

The quartz substrate was prepared in the same manner as in Example 1. Next, the quartz substrate was fixed to a substrate holder of a commercially available vacuum evaporation apparatus. Each of the resistance heating boats for deposition in the vacuum deposition apparatus was filled with an optimal amount for device fabrication. Resistance heating boats for deposition were made of molybdenum or tungsten.

The evaluation single film 4-1 was formed in the same manner as the evaluation single film 2-4 except that the host compound was changed from H-2 to H-4.

<Formation of Evaluation Multilayer Film 4-2>

After the single film 4-1 was formed, the resistance heating boat containing the compound PT-1 used for the protective layer was energized and heated to form a protective film having a film thickness of 30 nm, which was a laminated layer. Thus, the evaluation multilayer film 4-2 was prepared.

<Formation of Evaluation Multilayer Films 4-3 to 4-11>

The evaluation single films 4-3 to 4-11 were formed in the same manner as the formation of the evaluation multilayer film 4-2 except that the compound PT-1 used for the protective layer was changed as described in Table IV.

<Evaluation of Atmospheric Storage Stability of Evaluation Multilayer Film>

After each of the evaluation single film/multilayer films 4-1 to 4-11 was carried out from the vacuum evaporator to the atmosphere environment, the atmospheric storage stability was evaluated in the same manner as in Example 1. However, in order to prevent the luminescence influence of the protective layer, the change in the luminescence maximum peak intensity of the luminescent compound A was measured in the calculation of the luminescence intensity change of the multilayer film.

TABLE IV

| Evaluation single film/multilayer film | Protective layer material | Evaluation Relative value of luminescence remaining ratio | Remarks |
| --- | --- | --- | --- |
| 4-1 | None | 1.00 | Present invention |
| 4-2 | PT-1 | 1.29 | Present invention |
| 4-3 | PT-2 | 1.50 | Present invention |
| 4-4 | PT-3 | 1.49 | Present invention |
| 4-5 | PT-4 | 1.71 | Present invention |
| 4-6 | PT-5 | 1.77 | Present invention |
| 4-7 | PT-6 | 1.80 | Present invention |
| 4-8 | PT-7 | 1.74 | Present invention |
| 4-9 | PT-8 | 1.78 | Present invention |
| 4-10 | PT-9 | 1.90 | Present invention |
| 4-11 | PT-10 | 1.83 | Present invention |

As shown in Table IV, it was found that by providing a protective layer on the luminescent thin film according to the present invention to form a luminescent multilayer film, the effect of improving the atmospheric storage stability was large. In addition, it has been found that when compounds PT-2 and PT-3 having lone-electron pairs were provided in the protective layer, the effect of stabilizing the storage of air was further enhanced, and further, when a nitrogenous compound PT-4 to PT-10 was used in the protective layer, the effect was remarkably enhanced.

Example 5

In Example 5, in the luminescent multilayer film in which the second layer was provided on the luminescent thin film according to the present invention, the atmospheric storage stability was evaluated when the material in the second layer and the coating solvent were changed variously.

<Formation of Evaluation Single Film 5-1>

The quartz substrate was prepared in the same manner as in Example 1. The evaluation single film 5-1 was formed in the same manner as the evaluation single film 3-1 except that the host compound H-3 was replaced with H-5, the luminescent compound A-5 was replaced with A-4, and the oxide B-5-1 was replaced with B-4-3.

<Formation of Evaluation Multilayer Film 5-2>

The evaluation multilayer film 5-2 was formed by coating and laminating a protective layer after forming the evaluation single film 5-1. PT-11 was dissolved in acetonitrile at 0.6 mass % The obtained acetonitrile solution was used to form a film with a thickness of 30 nm on a quartz substrate by a spin coating method, and the film was dried at 100° C. for 30 minutes under a nitrogen gas atmosphere to form a evaluation multilayer film 5-2.

<Determination of Residual Solvent in Protective Layer>

The determination of the acetonitrile solvent remaining in the protective layer of the evaluation multilayer film 5-2 was carried out using GC-MS, and it was found that 0.1 mass % of acetonitrile remained <Formation of Evaluation Multilayer Films 5-3 to 5-18>

In forming the evaluation multilayer film 5-2, the evaluation multilayer films 5-3 to 5-18 were formed in the same manner except that the compound PT-11 used for the protective layer was changed as described in Table V, the solvent for applying the protective layer was changed from acetonitrile to that described in Table V, and the heat drying condition was changed as appropriate so that the residual solvent amount of the protective layer after drying was as described in Table V.

In Table V, LiF represents lithium fluoride, CaF represents calcium fluoride, TFPO represents 1H,1H,3H tetrafluoropropanol, and OFPO represents 1H,1H,5H octafluoropentanol.

<Evaluation of Atmospheric Storage Stability of Evaluation Multilayer Film>

After each of the evaluation single film/multilayer films 5-1 to 5-18 was carried out from the nitrogen atmosphere to the atmosphere environment, the atmospheric storage stability was evaluated in the same manner as in Example 1. However, in order to calculate the change in the emission intensity of the laminated film, the change in the emission maximum peak intensity of the luminescent compound A was measured to prevent the influence of the emission of the protective layer.

TABLE V

| Evaluation single film/ multilayer film | Protective layer coating | | | Evaluation | |
|---|---|---|---|---|---|
| | Material | Kind of solvent | Amount of residual solvent (mass %) | Relative value of luminescence remaining ratio | Remarks |
| 5-1 | None | — | — | 1.00 | Present invention |
| 5-2 | PT-11 | Acetonitrile | 0.100 | 1.29 | Present invention |
| 5-3 | PT-5 | Acetonitrile | 0.100 | 1.39 | Present invention |
| 5-4 | 20% LiF + PT-5 | Acetonitrile | 0.100 | 1.61 | Present invention |
| 5-5 | 20% CaF + PT-5 | Acetonitrile | 0.100 | 1.59 | Present invention |
| 5-6 | PT-12 | Acetonitrile | 0.100 | 1.65 | Present invention |
| 5-7 | PT-13 | Acetonitrile | 0.100 | 1.67 | Present invention |
| 5-8 | PT-11 | TFPO | 0.100 | 1.91 | Present invention |
| 5-9 | PT-11 | OFPO | 0.100 | 1.89 | Present invention |
| 5-10 | PT-11 | Trifluorobenzene | 0.100 | 1.90 | Present invention |
| 5-11 | PT-5 | TFPO | 0.100 | 1.97 | Present invention |
| 5-12 | PT-5 | OFPO | 0.100 | 1.96 | Present invention |
| 5-13 | PT-5 | Trifluorobenzene | 0.100 | 1.99 | Present invention |
| 5-14 | PT-5 | TFPO | 10.000 | 2.01 | Present invention |
| 5-15 | PT-5 | TFPO | 1.000 | 1.99 | Present invention |
| 5-16 | PT-5 | TFPO | 0.050 | 1.88 | Present invention |
| 5-17 | PT-5 | TFPO | 0.010 | 1.82 | Present invention |
| 5-18 | PT-5 | TFPO | 0.005 | 1.52 | Present invention |

As shown in Table V, it was found that by providing a protective layer on the luminescent thin film of the present invention to form a luminescent multilayer film, the effect of atmospheric storage stability was large. It was also found that the effect of air stabilization was enhanced in the evaluation single films 5-4 to 5-7 containing fluorine-containing compounds in the protective layer, and that the effect of air stabilization was remarkably enhanced in the evaluation single films 5-8 to 5-18 coated with a fluorine solvent in the protective layer. In addition, it was found that when the content of the fluorine solvent in the protective layer was less than 0.01 mass %, the effect was reduced.

Example 6

In Example 6, in the multilayer film in which the second layer was provided on the luminescent thin film according to the present invention, the atmospheric storage stability was evaluated when the coating process and the materials in the second layer and the coating solvent were changed variously.

<Formation of Evaluation Single Film 6-1>

The quartz substrate was prepared in the same manner as in Example 1. The evaluation single film 6-1 was formed in the same manner as the evaluation single film 1-1 except that the host compound was replaced with H-1 to H-5 and the luminescent compound A-1 was replaced with A-4, the coating and drying environment was changed to an atmospheric environment, and the drying time was changed to 120° C. and drying for 1 minute.

<Formation of Evaluation Single Films 6-2 and 6-3>

The evaluation single films 6-2 and 6-3 were formed in the same manner as the evaluation single film 6-1 except that the coating method was changed to the die coating method and the inkjet method, respectively.

<Formation of Evaluation Single Films 6-4 to 6-6>

In the evaluation single films 6-1 to 6-3, the evaluation single films 6-4 to 6-6 were formed in the same manner except that a part of the host compound H-5 was replaced with an oxide B-4-2 (H-5/A-4/B-4-2=75 mass %/20 mass %/5 mass %).

<Formation of Evaluation Multilayer Film 6-7>

The evaluation multilayer film 6-7 was formed by coating and laminating a protective layer after forming the evaluation single film 6-4. PT-5 was dissolved in acetonitrile at 0.6 mass %. The obtained acetonitrile solution was used to form a film with a thickness of 30 nm on a quartz substrate by a spin coating method, and the film was dried at 100° C. for 30 minutes in an air atmosphere to form a evaluation multilayer film 6-7. The residual solvent amount of the protective layer after drying was 0.1 mass %

<Formation of Evaluation Multilayer Films 6-8 to 6-18>

In the formation of the evaluation multilayer film 6-7, the evaluation laminate films 6-8 to 6-18 were formed in the same manner except that the coating method of the light-emitting layer and the protective layer was changed from the spin coating method as described in Table VI, the compound PT-5 used for the protective layer was changed as described in Table VI, the solvent for coating the protective layer was changed from acetonitrile as described in Table VI, and the heat drying condition was changed as appropriate so that the residual solvent amount of the protective layer after drying became 0.1 mass %.

In Table VI, LiF represents lithium fluoride, CaF represents calcium fluoride, TFPO represents 1H,1H,3H tetrafluoropropanol, and OFPO represents 1H,1H,5H octafluoropentanol.

<Evaluation of Atmospheric Storage Stability of Evaluation Multilayer Film>

After the drying process, each of the evaluation single film/multilayer films 6-1 to 6-18 was evaluated for atmospheric storage stability in the same manner as in Example 1. However, in order to prevent the luminescence influence of the protective layer, the change in the luminescence maximum peak intensity of the luminescent compound A was measured in the calculation of the luminescence intensity change of the multilayer film.

oxygen and water, which is increased by the inkjet printing method, can be solved by applying the luminescent thin film of the present invention. In particular, it can be seen that, in the case of a film containing a fluorine compound in the protective layer, even if the inkjet printing method is used, the atmospheric storability equivalent to that of the spin coating method can be secured.

Example 7

In Example 7, a verification of a coating process using a method of forming an oxide B from the luminescent compound A in the luminescent thin film of the present invention was performed.

<Formation of Comparative Evaluation Single Film 7-1>

The quartz substrate was prepared in the same manner as in Example 1. The comparative evaluation single film 7-1 was formed in the same manner as the evaluation single film 1-1 except that the host compound was changed from H-1 to H-3.

<Formation of Evaluation Single Film 7-2 to 7-6>

The evaluation single films 7-2 to 7-6 were formed in the same manner as the comparative evaluation single film 7-1 except that the coating environment and the drying conditions were changed as described in Table VII.

TABLE VI

| Evaluation single film/ multilayer film | Antioxidant | Coating method of light-emitting layer and protective layer | Protective layer coating Material | Kind of solvent | Evaluation Relative value of luminescence remaining ratio | Remarks |
| --- | --- | --- | --- | --- | --- | --- |
| 6-1 | None | Spin coating | None | — | 1.00 | Comparative example |
| 6-2 | None | Die coating | None | — | 1.00 | Comparative example |
| 6-3 | None | Inkjet coating | None | — | 0.86 | Comparative example |
| 6-4 | B-4-2 | Spin coating | None | — | 1.35 | Present invention |
| 6-5 | B-4-2 | Die coating | None | — | 1.34 | Present invention |
| 6-6 | B-4-2 | Inkjet coating | None | — | 1.28 | Present invention |
| 6-7 | B-4-2 | Spin coating | PT-5 | Acetonitrile | 1.48 | Present invention |
| 6-8 | B-4-2 | Inkjet coating | PT-5 | Acetonitrile | 1.42 | Present invention |
| 6-9 | B-4-2 | Spin coating | 20% LiF + PT-5 | Acetonitrile | 1.62 | Present invention |
| 6-10 | B-4-2 | Inkjet coating | 20% LiF + PT-5 | Acetonitrile | 1.60 | Present invention |
| 6-11 | B-4-2 | Spin coating | PT-12 | Acetonitrile | 1.65 | Present invention |
| 6-12 | B-4-2 | Inkjet coating | PT-12 | Acetonitrile | 1.63 | Present invention |
| 6-13 | B-4-2 | Spin coating | PT-5 | TFPO | 1.89 | Present invention |
| 6-14 | B-4-2 | Spin coating | PT-5 | OFPO | 1.88 | Present invention |
| 6-15 | B-4-2 | Spin coating | PT-5 | Trifluorobenzene | 1.90 | Present invention |
| 6-16 | B-4-2 | Inkjet coating | PT-5 | TFPO | 1.87 | Present invention |
| 6-17 | B-4-2 | Inkjet coating | PT-5 | OFPO | 1.87 | Present invention |
| 6-18 | B-4-2 | Inkjet coating | PT-5 | Trifluorobenzene | 1.90 | Present invention |

As shown in Table VI, it was found that the luminescent thin film containing the oxide B according to the present invention was a luminescent thin film having excellent atmospheric storage stability even when it was produced by a coating process other than the spin coating method. In addition, it was found that in the luminescent thin film 6-3 which was applied by the ink jet method under the air environment, the atmospheric storage stability was lower than in other application methods. It is presumed that this is because the surface area of the droplet contacting with the outside air increases due to the ejection of the droplet, so that it is more susceptible to water and oxygen than other coating methods. However, it has been found that the effect of <Component Analysis of Evaluation Single Films 7-1 to 7-6>

The evaluation single films 7-1 to 7-6 were analyzed for content and composition using a high-performance liquid chromatograph mass spectrometer (LC-MS, manufactured by Shimadzu Corporation). The content was calculated on the basis of a calibration curve measured in advance by LC-UV. As a result, the components of the oxide B satisfying the Equation (1), which were not detected in the comparative evaluation single film 7-1, were detected in the evaluation single films 7-3 to 7-6. In addition, other components presumed to be derived from the luminescent compound were detected together.

As other components, decomposition products as shown in the following structures were estimated from MS spectra detected by LC-MS. The following D-1 to D-7 are examples of other components derived from the luminescent material A-1 detected in Example 7.

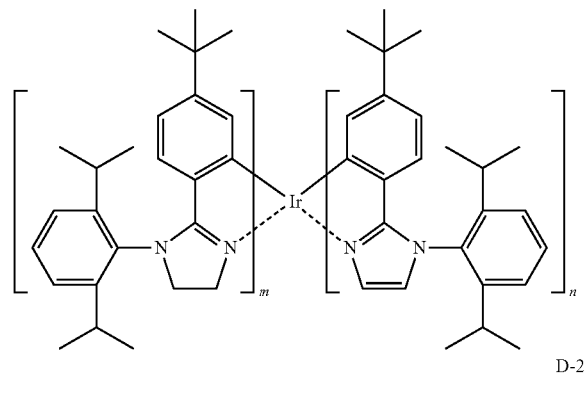

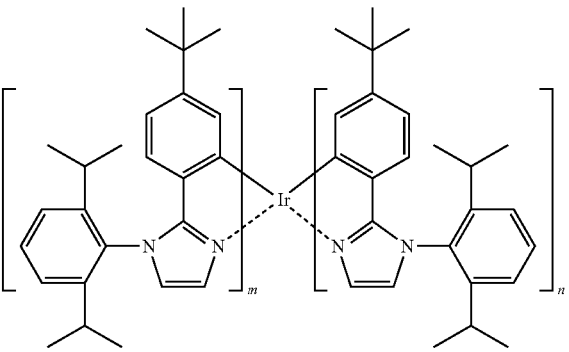

Here, m is an integer from 1 to 3, n is an integer from 0 to 2, and m+n=3 is satisfied.

<Evaluation of Luminescence Properties of Evaluation Single Films 7-1 to 7-6>

In order to grasp the influence of the generated components on each of the prepared evaluation single films 7-1 to 7-6, it was carried out immediately after the drying process to a room temperature state (23° C., 55% RH) and irradiated with light having an excitation wavelength of 300 nm to measure the emission spectrum and emission intensity in the room temperature state. Here, the ratio of the initial luminescence intensity of each evaluation single film when the evaluation single film 7-1 was set to a relative value of 1.00 was calculated as a relative value. The closer to 1.00, the less the extinction effect due to the generated component.

<Evaluation of Atmospheric Storage Stability of Evaluation Single Films 7-1 to 7-6>

After the emission spectra of each of the evaluation single films 7-1 to 7-6 were measured, the atmospheric storage stability was evaluated in the same manner as in Example 1.

TABLE VII

| Evaluation single film | Coating Coating atmosphere | Drying Drying atmosphere | Drying method | LC analysis Ratio of Luminescent material A/ Antioxidant B/Other components | Evaluation Intensity ratio of initial luminescence | Relative value of luminescence remaining ratio | Remarks |
|---|---|---|---|---|---|---|---|
| 7-1 | $N_2$ | $N_2$ | Heating at 120° C. for 30 minutes | 100/0/0 | 1.00 | 1.00 | Comparative example |
| 7-2 | $N_2$ | — | No drying | 100/0/0 | 1.01 | 1.01 | Comparative example |
| 7-3 | Air | Air | Heating at 120° C. for 30 minutes | 90.8/6.0/ 3.2 | 0.61 | 1.83 | Present invention |
| 7-4 | Air | $N_2$ | Heating at 120° C. for 30 minutes | 96.3/3.1/ 0.6 | 0.92 | 1.77 | Present invention |
| 7-5 | Air | Air | Heating under reduced pressure at 120° C. for 30 minutes | 95.3/4.0/ 0.7 | 0.95 | 1.71 | Present invention |
| 7-6 | Air | — | No drying | 98.9/1.0/ 0.1 | 0.98 | 1.72 | Present invention |

As shown in Table VII, it was found that the oxide B according to the present invention was newly formed in the evaluation single films 7-3 to 7-6 which were subjected to the air coating process, and the atmospheric storage stability was improved as an effect thereof. Further, as a preferable air coating process, it is a process of the evaluation single films 7-4 to 7-6 in which heating and drying under the air are not performed, and it is understood that the formation of other components such as decomposition products which are produced by-products is suppressed and the initial luminescence intensity can be maintained. On the other hand, it can be seen that the evaluation single film 7-3 which has been heated and dried under the atmosphere is excessively oxidized, and the amount of other components increases and the initial luminescence intensity decreases.

By carrying out such an air coating process, it is unnecessary to synthesize the oxide B in advance, and it becomes unnecessary to carry out a film forming process in an inert gas environment or a vacuum deposition environment, so that a luminescent thin film which is stable in the air can be manufactured at low cost.

Example 8

In Example 8, the method of generating the oxide B from the luminescent compound A described in Example 7 was used, and further, the process of applying the luminescent multilayer film in which the protective layer was laminated on the luminescent thin film was verified.

<Formation of Comparative Evaluation Multilayer Film 8-1>

The quartz substrate was prepared in the same manner as in Example 1. The comparative evaluation multilayer film 8-1 was formed by forming the evaluation single film 7-1 in the same manner except that the host compound was changed from H-3 to H-1 as the luminescent thin film, and then applying and laminating a protective layer. PT-6 was dissolved in TFPO at 0.5 mass %. Using the obtained TFPO solution, a 30 nm-thick film was formed on a quartz substrate by a spin-coating method, and the quartz substrate was dried at 120° C. for 30 minutes in a nitrogen-gas atmosphere to form a comparative evaluation multilayer film 8-1. The residual solvent amount of TFPO in the protective layer was 0.1 mass %.

<Formation of Evaluation Multilayer Films 8-2 to 8-7>

The evaluation multilayer films 8-2 to 8-7 were produced in the same manner as the comparative evaluation multilayer film 8-1 except that the coating environments and the dry conditions were changed as described in Table VIII.

<Component Analysis of Films 8-1 to 8-7>

The contents and components of the respective evaluation multilayer films 8-1 to 8-7 were analyzed by LC-MS. As a result, the components of the oxide B satisfying the Equation (1), which were not detected in the comparative evaluation multilayer films 8-1 and 8-2, were detected in the evaluation single films 8-3 to 8-7. In addition, other components presumed to be derived from the luminescent compound were detected together.

From the detected MS spectrum, it was estimated that the other components contained the same components as those described in Example 7.

<Evaluation of Luminescence Properties of Evaluation Multilayer Films 8-1 to 8-7>

In order to grasp the influence of the generated components on each of the produced evaluation multilayer films 8-1 to 8-7, light with an excitation wavelength of 300 nm was irradiated immediately after being carried out in an atmospheric environment, and the emission spectrum in a room temperature state (23° C., 55% RH) and the emission intensity of the luminescent compound A were measured. Here, the ratio of the initial emission intensity of each evaluation single film was calculated as a relative value when the evaluation laminated film 8-1 was set to a relative value of 1.00. The closer to 1.00, the less the extinction effect due to the generated component.

<Evaluation of Atmospheric Storage Stability of Evaluation Single Films 8-1 to 8-7>

After the emission spectra of each of the evaluation single films 8-1 to 8-7 were measured, the atmospheric storage stability was evaluated in the same manner as in Example 1.

TABLE VIII

| Evaluation multilayer film | First layer | | | Second layer | | | LC analysis Ratio of Luminescent material A/ Antioxidant B/ Other components | Evaluation | | Remarks |
| | Coating | Drying | | Coating | Drying | | | Ratio of initial luminescence intensity | Relative value of luminescence remaining ratio | |
| | Coating atmosphere | Drying atmosphere | Drying method | Coating atmosphere | Drying atmosphere | Drying method | | | | |
|---|---|---|---|---|---|---|---|---|---|---|
| 8-1 | $N_2$ | $N_2$ | Heating at 120° C. for 30 minutes | $N_2$ | $N_2$ | Heating at 120° C. for 30 minutes | 100/0/0 | 1.00 | 1.00 | Comparative example |
| 8-2 | $N_2$ | — | No drying | $N_2$ | $N_2$ | Heating at 120° C. for 30 minutes | 100/0/0 | 1.01 | 0.99 | Comparative example |
| 8-3 | Air | Air | Heating at 120° C. for 30 minutes | Air | Air | Heating at 120° C. for 30 minutes | 91.2/6.2/2.6 | 0.52 | 1.81 | Present invention |
| 8-4 | Air | — | No drying | Air | Air | Heating at 120° C. for 60 minutes | 97.6/2.1/0.3 | 0.96 | 1.72 | Present invention |
| 8-5 | Air | — | No drying | Air | $N_2$ | Heating at 120° C. for 60 minutes | 98.8/1.1/0.1 | 0.98 | 1.69 | Present invention |
| 8-6 | Air | — | No drying | Air | Air | Heating under reduced pressure at 120° C. for 60 minutes | 98.2/1.7/0.1 | 0.96 | 1.75 | Present invention |
| 8-7 | Air | Air | Heating under reduced pressure at 120° C. for 30 minutes | Air | Air | Heating under reduced pressure at 120° C. for 30 minutes | 95.7/3.6/0.7 | 0.91 | 1.79 | Present invention |

As shown in Table VIII, it was found that oxide B was newly formed in the evaluation multilayer films 8-3 to 8-7 in which the air coating process was carried out, and the air storage stability was improved as the effect. Further, as a preferable air coating process, it is a process of the evaluation multilayer films 8-4 to 8-7 in which heating and drying are not performed under the air at the time of forming the light-emitting layer, and it can be understood that generation of other components such as decomposition products which are sub-generated can be suppressed and the initial light emission intensity can be maintained. In particular, in the process of the evaluation multilayer film 8-4, it can be seen that the formation of other components is suppressed and high initial luminescence and atmospheric storage stability are compatible, despite the lowest cost process in which an inert gas environment or a vacuum/reduced pressure environment is not used. It is presumed that this result is because the luminescent film is dried in a state of being covered with the protective layer in the process of the evaluation multilayer film 8-4, so that entry of air into the luminescent layer is suppressed during drying, excessive oxidation of the luminescent compound A is suppressed, and generating of decomposition products involved in quenching of the luminescent compound A may be suppressed.

Example 9

In Example 9, evaluation was done on the driving stability of a lighting device (and an element) in which a luminescent thin film excellent in atmospheric stability according to the present invention was incorporated as a coating film.
<Preparation of Evaluation Lighting Device 9-1>
(Preparation of Base Material)
First, on the entire surface of a polyethylene naphthalate film (PEN: manufactured by Teijin DuPont Film Co., Ltd.) on which an anode was formed, an inorganic gas barrier layer made of SiOx was formed to a layer thickness of 500 nm by using an atmospheric pressure plasma discharge treatment device having a structure described in JP-A 2004-68143. Thus, a flexible base material having a gas barrier property with an oxygen permeability of 0.001 mL/(m²·24 h·atom) or less and a water vapor permeability of 0.001 g/(m²·24 h) or less was produced.
(Formation of Anode)
ITO (indium tin oxide) having a thickness of 120 nm was deposited on the base material by a sputtering method, and patterned by a photolithography method to form an anode. The pattern was such that the area of the light-emitting region was 5 cm×5 cm.
(Formation of hole injection layer)
The base material on which the anode was formed was ultrasonically cleaned with isopropyl alcohol, dried with dry nitrogen gas, and subjected to UV ozone cleaning for 5 minutes. Then, a 2 mass % solution obtained by diluting a poly(3,4-ethylenedioxythiophene)/polystyrene sulfonate (PEDOT/PSS) dispersion solution prepared in the same manner as in Example 16 of JP-A 4509787 was applied onto the base material on which the anode was formed by a die coating method. The resultant solution was air-dried to form a hole injection layer having a layer thickness of 40 nm.
(Formation of Hole Transport Layer)
Next, the base material on which the hole injection layer was formed was coated at 5 m/min by a die coating method using a coating solution for forming a hole transporting layer having the following compositions in a nitrogen atmosphere, and was naturally dried, and then held at 130° C. for 30 minutes to form a hole transporting layer having a thickness of 30 mm <Coating Solution for Forming Hole Transport Layer>

Hole transport materials (example compound HT-1) (weight-average molecular weight Mw=80000):
10 parts by mass
Chlorobenzene: 3000 parts by mass (Formation of Light-Emitting Layer)

Next, an evaluation single film 1-1 was formed on the base material on which the hole transporting layer was formed by the method described in Example 1 under a nitrogen environment to obtain a light-emitting layer.

(Formation of Electron Transport Layer)

Next, the transparent substrate was fixed to a substrate holder of a commercially available vacuum evaporation apparatus.

Each of the resistance heating boats for deposition in the vacuum deposition apparatus was filled with the constituent material of each layer in an amount optimum for device fabrication. Resistance heating boats for deposition were made of molybdenum or tungsten.

After reducing the degree of vacuum to $1\times10^{-4}$ Pa, a resistance heating boat containing PT-5 was energized and heated, and vapor deposition was performed on the light emitting layer at a vapor deposition rate of 0.1 nm/sec to form an electron transport layer having a layer thickness of 40 nm. Lithium fluoride was deposited thereon to a layer thickness of 0.5 nm, and then aluminum was deposited to a thickness of 100 nm to form a cathode, thereby an organic EL element for evaluation was prepared.

(Sealing)

A sealing substrate was adhered to the laminate formed by the above steps using a commercially available roll laminating device.

As a sealing substrate, an aluminum foil having flexibility and a thickness of 30 µm (manufactured by Toyo Aluminum Co., Ltd.) was provided with an adhesive layer having a layer thickness of 1.5 µm using a two-component reaction type urethane adhesive for thy lamination, and a polyethylene terephthalate (PET) film having a thickness of 12 µm was laminated.

A thermosetting adhesive as a sealing adhesive was uniformly applied with a thickness of 20 µm along the adhesive surface (gloss surface) of the aluminum foil of the sealing substrate using a dispenser. This was dried under a vacuum of 100 Pa or less for 12 hours. Further, the sealing substrate was moved to a nitrogen atmosphere having a dew point temperature of −80° C. or less and an oxygen concentration of 0.8 ppm and dried for 12 hours or more, and the moisture content of the sealing adhesive was adjusted to be 100 ppm or less.

As the thermosetting adhesive, an epoxy adhesive obtained by mixing the following (A) to (C) was used.
(A) Bisphenol A diglycidyl ether (DGEBA)
(B) Dicyandiamide (DICY)
(C) Epoxy adduct type curing accelerator The sealing substrate was brought into close contact with the above laminate body and tightly sealed under a pressure bonding condition of a pressure roll temperature of 100° C., a pressure of 0.5 MPa, and a machine speed of 0.3 m/min using a pressure roll. Thus, an evaluation lighting device 9-1 was manufactured.

<Preparation of Evaluation Lighting Devices 9-2 to 9-18>

As described above, the light-emitting layer of the evaluation lighting device 9-1 was formed in the same manner as preparation of the evaluation single film 1-1 of Example 1. The evaluation lighting device 9-2 to 9-18 were prepared in the same manner as used for the preparation of the evaluation illumination device 9-1, except that the method of forming the light-emitting layer was changed to the same method as preparation of the evaluation single film 1-2 to 1-18 of Example 1.

<Evaluation of Continuous Driving Stability (Luminescence Lifetime)>

The half-life was evaluated as the continuous driving stability (luminescence lifetime) according to the following measurement method.

The respective lighting devices were driven at a constant current by a current that gives an initial luminance 4000 cd/m² at 85° C. and 85% RH to obtain a time of ½ of the initial luminance, and this time was used as a measure of the luminescence lifetime as a half-life. Incidentally, the emission lifetime was expressed by a relative ratio (LT ratio) to the relative value 1.00 of the lighting device 9-1. Incidentally, it indicates that the larger the value is excellent in continuous driving stability (luminescence lifetime) with respect to the lighting device 9-1.

TABLE IX

| Lighting device No. | Antioxidant | Evaluation Relative value of luminescence lifetime | Remarks |
| --- | --- | --- | --- |
| 9-1 | None | 1.00 | Comparative example |
| 9-2 | C-1 | 1.05 | Comparative example |
| 9-3 | C-2 | 1.04 | Comparative example |
| 9-4 | C-3 | 0.99 | Comparative example |
| 9-5 | C-4 | 1.08 | Comparative example |
| 9-6 | C-5 | 1.12 | Comparative example |
| 9-7 | C-6 | 1.07 | Comparative example |
| 9-8 | C-7 | 1.01 | Comparative example |
| 9-9 | B-1-8 | 1.42 | Present invention |
| 9-10 | B-1-9 | 1.36 | Present invention |
| 9-11 | B-1-1 | 1.71 | Present invention |
| 9-12 | B-1-4 | 1.60 | Present invention |
| 9-13 | B-1-5 | 1.72 | Present invention |
| 9-14 | B-1-6 | 1.75 | Present invention |
| 9-15 | B-1-7 | 1.82 | Present invention |
| 9-16 | B-1-11 | 1.69 | Present invention |
| 9-17 | B-1-12 | 1.74 | Present invention |
| 9-18 | B-1-15 | 1.77 | Present invention |

As shown in Table IX, in the lighting devices 9-9 to 9-18 in which the luminescent thin film of the present invention having excellent atmospheric storage stability was used for the light-emitting layer, it was found that a long-life lighting device was manufactured in an environment of 85° C. and 85% RH in which the air is likely to enter the element and cause emission inhibition.

Example 10

In Example 10, the driving stability of the lighting device (and the element) when the luminescent thin film of the present invention having excellent atmospheric storage stability was incorporated as a vapor deposition film and the electrodes were changed appropriately was evaluated.

<Preparation of Evaluation Lighting Device 10-1>

The preparation of the base material, the formation of the anode, and the formation of the hole injection layer were performed in the same manner as in Example 9.

Next, the transparent substrate was fixed to a substrate holder of a commercially available vacuum evaporation apparatus.

Each of the resistance heating boats for deposition in the vacuum deposition apparatus was filled with the constituent material of each layer in an amount optimum for device fabrication. Resistance heating boats for deposition were made of molybdenum or tungsten.

After reducing the degree of vacuum to 1×10' Pa, a resistance heating boat containing HT-2 was energized and heated, and vapor deposition was performed on the hole injection layer at a vapor deposition rate of 0.1 nm/sec to form a hole transport layer having a layer thickness of 20 mm Next, the resistance heating boats containing the host compound H-2 and the luminescent compound A-3 were energized and heated, and the host compound H-2 and the luminescent compound A-3 were co-evaporated to be 85 volume % and 15 volume %, respectively, to form a light-emitting layer having a thickness of 50 mm Then, PT-6 was deposited at a deposition rate of 0.1 nm/sec to form an electron transport layer with a layer thickness of 40 nm.

Lithium fluoride was deposited thereon to a layer thickness of 0.5 nm, and then aluminum was deposited to a thickness of 100 nm to form a cathode, thereby fabricating an organic EL element for evaluation.

The sealing process was performed by sealing using the same method as described in Example 9, and to produce the evaluation lighting device 10-1 was produced.
<Preparation of Evaluation Lighting Device 10-2>

In forming the light-emitting layers of the evaluation illumination device 10-1, the evaluation lighting device 10-2 was manufactured in the same manner except that a part of the host compound H-2 was replaced with an oxide B-3-2 and co-evaporation was performed so that the host compound H-2, the luminescent compound A-3, and the oxide B-3-2 were 84 volume %, 15 volume %, and 1 volume %, respectively.
<Preparation of Evaluation Lighting Devices 10-3 to 10-6>

In the preparation of the evaluation lighting apparatus 10-2, the preparation of the evaluation lighting devices 10-3 to 10-6 was carried out in the same manner except that the cathode was changed as described in Table X.

In addition, as the values of the work functions of the metals in the description of the present invention, values known in the literature may be used (for example, Herbert B. Michaelson, "The work function of the elements and its periodicity, Journal of Applied Physics, November 1977, Vol. 48, No. 11, pp. 4729-4733".
<Evaluation of Continuous Driving Stability (Luminescence Lifetime)>

The half-life was evaluated according to the method described in Example 9. The half-life was expressed by a relative ratio (LT ratio) with the lighting apparatus 10-1 as a relative value 1.00. The larger the value indicates that it is superior to the continuous driving stability (emission lifetime) compared with the lighting device 10-1.

TABLE X

| Lighting device No. | Antioxidant | Cathode | Work function (eV) | Evaluation Relative value of luminescence lifetime | Remarks |
| --- | --- | --- | --- | --- | --- |
| 10-1 | None | Al | 4.28 | 1.00 | Comparative example |
| 10-2 | B-3-2 | Al | 4.28 | 1.64 | Present invention |
| 10-3 | B-3-2 | Mg | 3.66 | 1.41 | Present invention |
| 10-4 | B-3-2 | Ag | 4.26 | 1.84 | Present invention |
| 10-5 | B-3-2 | Au | 5.10 | 1.86 | Present invention |
| 10-6 | B-3-2 | Co | 5.00 | 1.90 | Present invention |

As shown in Table X, it was found that the lighting devices 10-2 to 10-6 using the luminescent thin film having excellent atmospheric storage stability of the present invention as a light-emitting layer were able to manufacture a lighting device having a long lifetime in an environment of 85° C. and 85% RH in which the atmosphere easily intrudes into the device and causes light emission inhibition. Furthermore, it was found that the lighting devices 10-2, 10-4 to 10-6 using aluminum, silver, gold, and cobalt with the work function of the electrodes used in the devices being more than 4.2 eV become longer-lived lighting devices. Especially, the lighting device using silver, gold and cobalt became a longer life lighting device and was found to be preferable. It is highly probable that this was effective in improving the driving stability of the lighting device by improving the atmospheric stability of the electrode.

Example 11

In Example 11, the driving stability of the white lighting device (and the element) when the atmosphere-stable luminescent thin film according to the present invention was incorporated as a coating film and the content of the oxide B was appropriately changed was evaluated.
<Preparation of Evaluation Lighting Device 11-1>

The preparation of the base material, the formation of the anode, the formation of the hole injection layer, and the hole transport layer were performed in the same manner as in Example 9.
(Formation of Light-Emitting Layer)

A host compound H-1 and luminescent compounds A-2, A-4, and A-5 (H-1/A-2A-4A-5=89.4 mass %/10 mass %/0.3 mass %/0.3 mass %/0.3 mass %) were dissolved in normal butyl acetate at 1.0 mass %. Using the obtained normal butyl acetate solution, a film with a thickness of 50 nm was formed on a quartz substrate by a spin coating method, and the film was dried at 120° C. for 30 minutes in a nitrogen gas atmosphere to form a light-emitting layer.
(Formation of Electron Transport Layer)

PT-9 was dissolved in TFPO at 0.5 mass %. Using the obtained TFPO solution, a 30 nm-thick film was formed on a quartz substrate by a spin-coating method, and the quartz substrate was dried at 120° C. for 30 minutes in a nitrogen-gas atmosphere to form an electron transport layer.
(Formation of Cathode)

Next, the transparent substrate was fixed to a substrate holder of a commercially available vacuum evaporation apparatus.

After reducing the degree of vacuum to $1\times10^{-4}$ Pa, 100 nm of silver was vapor-deposited to form a cathode, and an organic EL element for evaluation was prepared. In the sealing step, the same method as that described in Example 9 was used for sealing, and the evaluation lighting device 11-1 was manufactured.
<Preparation of Evaluation Lighting Devices 11-2 to 11-13>

In forming the light-emitting layer of the evaluation lighting device 11-1, the evaluation lighting devices 11-2 to 11-13 were produced in the same manner except that a part of the host compound H-1 was replaced with an oxide B-2-6, and the host compound H-1 and the oxide B-2-6 were contained at 89 4-X mass % and X mass %, respectively, as described in Table XI to form the light-emitting layer.
<Evaluation of External Extraction Quantum Efficiency (EQE)>

The respective lighting devices were energized at room temperature (about 23° C.) under 2.5 mA/cm² constant current conditions, and the emission luminance (L0) [cd/m²]

immediately after the light emission was started was measured to calculate the external extraction quantum efficiency (EQE).

Here, the measurement of the emission luminance was performed using a CS-2000 (manufactured by Konica Minolta Co., Ltd.), the external extraction quantum efficiency was expressed by a relative ratio of the illumination device 11-1 as a relative value 1.00. It should be noted that the larger the value, the better the luminous efficiency.

<Evaluation of Continuous Driving Stability (Luminescence Lifetime)>

The half-life was evaluated according to the method described in Example 8. The half-life was expressed by a relative ratio (LT ratio) with the lighting apparatus 11-1 as a relative value 1.00. The larger the value indicates that it is superior to the continuous driving stability (emission lifetime) compared with the lighting device 11-1.

<Formation of Evaluation Single Films 11-1 to 11-13>

Similar to the method of forming the light-emitting layers of each of the lighting devices 11-1 to 11-13, the light-emitting layers of each of the lighting devices were formed on a quartz substrate to form evaluation single films 11-1 to 11-13.

<Evaluation of Atmospheric Storage Stability of Evaluation Single Films 11-1 to 11-13>

Each of the formed evaluation single films 11-1 to 11-13 was evaluated for atmospheric storage stability in the same manner as in Example 1. Here, when the evaluation single film 11-1 was set to a relative value of 1.00, the ratio of the luminescence remaining ratio of each evaluation single film was calculated as a relative value. The larger the value is than 1.00, the higher the luminescence remaining ratio at the time of atmospheric storage and the better the atmospheric storage stability.

is because, when the content of the antioxidant B exceeds the content of the luminescent material A, carriers are easily trapped in the antioxidant B at the time of energization, which causes a decrease in luminous efficiency.

In addition, it was found that the content ratio of the antioxidant B is preferably 0.001 mass % or more, and more preferably 0.01 mass % or more in order to exhibit the atmosphere stable luminescence characteristic according to the present invention.

Example 12

In Example 12, the driving stability of the lighting device (and the element) was evaluated when the luminescent thin film of the present invention was manufactured by using the atmospheric coating method in which the oxide B was generated from the luminescent compound A.

<Preparation of Evaluation Lighting Device 12-1>

HT-1 was dissolved in para-xylene at 0.7 mass % in a nitrogen-atmosphere. Using the obtained xylene solution, a film with a thickness of 30 nm was formed on a quartz substrate by a spin coating method, and the film was dried at 120° C. for 30 minutes in a nitrogen gas atmosphere to form a hole transport layer.

(Formation of Light-Emitting Layer and Electron Transport Layer)

The light-emitting layer and the electron transport layer were formed in the same manner as in the comparative evaluation multilayer film 8-1 of Example 8 except that PT-6 was replaced with PT-9 as the electron transport layer.

(Formation of Cathode)

Next, the transparent substrate was fixed to a substrate holder of a commercially available vacuum evaporation apparatus.

TABLE XI

| Lighting device No. | Antioxidant | Content X (mass %) of antioxidant B | Content X (mass %) of antioxidant B with respect to luminescent material A-2 | Evaluation of luminescent film Relative value of luminescence remaining ratio | Element evaluation Relative value of EQE | Relative value of luminescence lifetime | Remarks |
|---|---|---|---|---|---|---|---|
| 11-1 | None | — | 0 | 1.00 | 1.00 | 1.00 | Comparative example |
| 11-2 | B-2-6 | 15.0 | 150 | 1.62 | 0.62 | 1.82 | Present invention |
| 11-3 | B-2-6 | 10.0 | 100 | 1.64 | 0.95 | 1.84 | Present invention |
| 11-4 | B-2-6 | 5.0 | 50 | 1.59 | 0.98 | 1.79 | Present invention |
| 11-5 | B-2-6 | 1.0 | 10 | 1.60 | 1.01 | 1.72 | Present invention |
| 11-6 | B-2-6 | 0.5 | 5.0 | 1.61 | 1.02 | 1.73 | Present invention |
| 11-7 | B-2-6 | 0.1 | 1.0 | 1.62 | 1.01 | 1.77 | Present invention |
| 11-8 | B-2-6 | 0.05 | 0.5 | 1.60 | 0.99 | 1.69 | Present invention |
| 11-9 | B-2-6 | 0.01 | 0.10 | 1.63 | 1.03 | 1.70 | Present invention |
| 11-10 | B-2-6 | 0.005 | 0.05 | 1.62 | 0.98 | 1.68 | Present invention |
| 11-11 | B-2-6 | 0.001 | 0.01 | 1.59 | 0.98 | 1.69 | Present invention |
| 11-12 | B-2-6 | 0.0001 | 0.001 | 1.39 | 1.01 | 1.38 | Present invention |
| 11-13 | B-2-6 | 0.00001 | 0.0001 | 1.22 | 0.97 | 1.21 | Present invention |

As shown in Table XI, for the white lighting devices 11-2 to 11-13 using the light-emitting thin film excellent in the atmospheric storage stability of the present invention as the light-emitting layer, it was found that a lighting device having a long lifetime was manufactured in an environment of 85° C. and 85% RH in which the atmosphere easily intrudes into the device and causes the light emission inhibition.

Further, it has been found that the content of the antioxidant B to the luminescent material A is preferable 100 mass % or less in order to maintain EQE. It is presumed that this After reducing the degree of vacuum to $1 \times 10^{-4}$ Pa, 100 nm of silver was vapor-deposited to form a cathode, and an organic EL element for evaluation was prepared. In the sealing step, the same method as that described in Example 9 was used for sealing, and the evaluation lighting device 11-1 was manufactured.

<Preparation of Evaluation Lighting Devices 12-2 to 12-7>

In the formation of the light-emitting layer and the electron transporting layer of the evaluation lighting device 12-1, preparation was performed in the same manner except that the coating environment and the drying conditions were changed as described in Table XII.

<Component Analysis of Light-Emitting Layer in Lighting Devices 12-1 to 12-7>

The content and components of the luminescent layers in the respective evaluation lighting devices 12-1 to 12-7 were analyzed by LC-MS. As a result, components of oxide B satisfying equation (1), which were not detected in the lighting apparatus 12-1 and 12-2 of the comparison, were detected in the evaluation lighting devices 12-3 to 12-7. In addition, other components presumed to be derived from the luminescent material were detected together.

<Evaluation of External Extraction Quantum Efficiency (EQE)>

The externally extraction quantum efficiency was evaluated according to the method described in Example 11. The externally extraction quantum efficiency was expressed in terms of a relative ratio with a relative value of 1.00 for the illuminator 12-1. It should be noted that the larger the value, the better the luminous efficiency.

<Evaluation of Continuous Driving Stability (Luminescence Lifetime)>

The half-life was evaluated according to the method described in Example 9. The half-life was expressed by a relative ratio (LT ratio) with the lighting apparatus 12-1 as a relative value 1.00. The larger the value indicates that it is superior to the continuous driving stability (emission lifetime) compared with the lighting device 12-1.

components such as decomposition products which are produced by-products is suppressed and the EQE can be maintained. In particular, in the process of the lighting device 12-4, it can be seen that, despite the lowest cost process in which an inert gas environment or a vacuum/decompression environment is not used, the generation of other components is suppressed, and high initial luminescence and atmospheric storage stability are compatible.

Example 13

In Example 13, the driving stability of the illumination device (and the element) was evaluated when the luminescent thin film of the present invention was produced by inkjet coating from the hole transport layer to the cathode by using the atmospheric coating method in which the oxide B was produced from the luminescent compound A.

<Preparation of Evaluation Lighting Device 13-1>

The preparation of the base material and the formation of the anode were carried out in the same manner as in Example 9. The hole injection layer was formed in the same manner as in Example 9 except that the coating method was changed to the inkjet printing method. The hole transport layer was formed in the same manner as in Example 12 except that the coating method was changed to an inkjet printing method.

TABLE XII

| Lighting device No. | First layer | | | Second layer | | | LC analysis Ratio of Luminescent material A/Antioxidant B/Other components | Evaluation | | Remarks |
|---|---|---|---|---|---|---|---|---|---|---|
| | Coating atmosphere | Drying atmosphere | Drying method | Coating atmosphere | Drying atmosphere | Drying method | | Relative value of EQE | Relative value of luminescence lifetime | |
| 12-1 | $N_2$ | $N_2$ | Heating at 120° C. for 30 minutes | $N_2$ | $N_2$ | Heating at 120° C. for 30 minutes | 100/0/0 | 1.00 | 1.00 | Comparative example |
| 12-2 | $N_2$ | — | No drying | $N_2$ | $N_2$ | Heating at 120° C. for 60 minutes | 100/0/0 | 0.98 | 1.01 | Comparative example |
| 12-3 | Air | Air | Heating at 120° C. for 30 minutes | Air | Air | Heating at 120° C. for 30 minutes | 91.2/6.0/2.8 | 0.57 | 1.78 | Present invention |
| 12-4 | Air | — | No drying | Air | Air | Heating at 120° C. for 60 minutes | 97.8/2.0/0.2 | 0.98 | 1.80 | Present invention |
| 12-5 | Air | — | No drying | Air | $N_2$ | Heating at 120° C. for 60 minutes | 98.6/1.3/0.1 | 1.01 | 1.73 | Present invention |
| 12-6 | Air | — | No drying | Air | Air | Heating under reduced pressure at 120° C. for 60 minutes | 97.4/2.5/0.1 | 0.94 | 1.81 | Present invention |
| 12-7 | Air | Air | Heating under reduced pressure at 120° C. for 30 minutes | Air | Air | Heating under reduced pressure at 120° C. for 30 minutes | 98.3/1.5/0.2 | 0.96 | 1.76 | Present invention |

As shown in Table XII, it was found that lighting devices 12-3 to 12-7 in which oxide B was generated by using the air coating process were able to manufacture lighting devices with a long lifetime in an environment of 85° C. and 85% RH in which the air easily penetrates into the device and causes light emission inhibition. Further, in the lighting devices 12-4 to 12-7 which do not perform heating and drying under the atmosphere at the time of forming the light emitting layer, it is understood that the generation of other (Formation of Light-Emitting Layer and Electron Transport Layer)

The light-emitting layer and the electron-transporting layer were formed in the same manner as the comparative evaluation multilayer film 8-1 of Example 8 except that the light-emitting material A-1 was replaced with A-3, PT-6 was replace with PT-9 for the electron-transport layer, and the coating method was changed to the inkjet printing method.

(Formation of Cathode)

Next, a mercury ink was applied by an inkjet method in an air environment, and dried at 120° C. for 60 minutes in an air environment to form a cathode having a thickness of 100 nm.

<Preparation of Evaluation Lighting Devices 13-2 to 13-14>

The preparation of each lighting device was performed in the same manner as in the formation of the hole transport layer, the light-emitting layer, the electron transport layer, and the cathode of the evaluation lighting device 13-1, except that the coating environment and the drying conditions were changed as shown in Table XIII.

<Component Analysis of Light-Emitting Layer in the Lighting Devices 13-1 to 13-14>

The content and components of the light-emitting layers in the respective evaluation lighting devices 13-1 to 13-14 were analyzed by LC-MS. As a result, the component of the oxide B satisfying the Equation (1) with respect to the luminescent compound A-3 was detected in the evaluation lighting devices 13-8 to 13-14. This component was not detected in the comparative evaluation lighting devices 13-1 to 13-7. In addition, other components presumed to be derived from the luminescent material were detected.

<Evaluation of External Extraction Quantum Efficiency (EQE)>

The externally extraction quantum efficiency was evaluated according to the method described in Example 11. The externally extraction quantum efficiency was expressed in terms of a relative ratio with a relative value of 1.00 for the illuminator 13-1. It should be noted that the larger the value, the better the luminous efficiency.

<Evaluation of Continuous Driving Stability (Luminescence Lifetime)>

The half-life was evaluated according to the method described in Example 9. The half-life was expressed by a relative ratio (LT ratio) with the lighting apparatus 13-1 as a relative value 1.00. The larger the value indicates that it is superior to the continuous driving stability (emission lifetime) compared with the lighting device 13-1.

TABLE XIII

| Lighting device No. | Hole transport layer coating process | | | Light-emitting layer coating process | | | Electron transport layer coating process | | |
|---|---|---|---|---|---|---|---|---|---|
| | Coating | Drying | | Coating | Drying | | Coating | Drying | |
| | Coating atmosphere | Drying atmosphere | Drying method | Coating atmosphere | Drying atmosphere | Drying method | Coating atmosphere | Drying atmosphere | Drying method |
| 13-1 | $N_2$ | $N_2$ | *a | $N_2$ | $N_2$ | *a | $N_2$ | $N_2$ | *a |
| 13-2 | $N_2$ | $N_2$ | No drying | $N_2$ | $N_2$ | No drying | $N_2$ | $N_2$ | *c |
| 13-3 | $N_2$ | $N_2$ | No drying | $N_2$ | $N_2$ | No drying | $N_2$ | $N_2$ | No drying |
| 13-4 | $N_2$ | $N_2$ | *a | $N_2$ | $N_2$ | *1*a | $N_2$ | $N_2$ | *a |
| 13-5 | $N_2$ | $N_2$ | *1*a | $N_2$ | $N_2$ | *1*a | $N_2$ | $N_2$ | *1*a |
| 13-6 | $N_2$ | $N_2$ | No drying | $N_2$ | $N_2$ | No drying | $N_2$ | $N_2$ | *1*b |
| 13-7 | $N_2$ | $N_2$ | No drying | $N_2$ | $N_2$ | No drying | $N_2$ | $N_2$ | No drying |
| 13-8 | Air | Air | *a | Air | Air | *a | Air | Air | *a |
| 13-9 | Air | Air | No drying | Air | Air | No drying | Air | Air | *c |
| 13-10 | Air | Air | No drying | Air | Air | No drying | Air | Air | No drying |
| 13-11 | Air | Air | *a | Air | Air | *1*a | Air | Air | *a |
| 13-12 | Air | Air | *1*a | Air | Air | *1*a | Air | Air | *1*a |
| 13-13 | Air | Air | No drying | Air | Air | No drying | Air | Air | *1*b |
| 13-14 | Air | Air | No drying | Air | Air | No drying | Air | Air | No drying |

| Lighting device No. | Silver coating process | | | LC analysis Ratio of Luminescent material A/ Antioxidant B/ Other components | Element properties | | Remarks |
|---|---|---|---|---|---|---|---|
| | Coating | Drying | | | | | |
| | Coating atmosphere | Drying atmosphere | Drying method | | Relative value of EQE | Relative value of luminescence lifetime | |
| 13-1 | $N_2$ | $N_2$ | *b | 100/0/0 | 1.00 | 1.00 | Comparative example |
| 13-2 | $N_2$ | $N_2$ | *b | 100/0/0 | 0.98 | 0.98 | Comparative example |
| 13-3 | $N_2$ | $N_2$ | *b | 100/0/0 | 1.02 | 0.99 | Comparative example |
| 13-4 | $N_2$ | $N_2$ | *b | 100/0/0 | 1.00 | 1.00 | Comparative example |
| 13-5 | $N_2$ | $N_2$ | *b | 100/0/0 | 1.00 | 1.00 | Comparative example |
| 13-6 | $N_2$ | $N_2$ | *b | 100/0/0 | 0.98 | 0.98 | Comparative example |
| 13-7 | $N_2$ | $N_2$ | *1*b | 100/0/0 | 1.02 | 0.99 | Comparative example |
| 13-8 | Air | Air | *b | 98.4/0.9/0.7 | 0.72 | 1.72 | Present invention |
| 13-9 | Air | Air | *b | 99.2/0.6/0.2 | 1.00 | 1.80 | Present invention |
| 13-10 | Air | Air | *b | 99.4/0.5/0.1 | 1.01 | 1.77 | Present invention |

TABLE XIII-continued

| 13-11 | Air | Air | *b | 98.9/0.8/0.3 | 0.96 | 1.75 | Present invention |
| 13-12 | Air | Air | *b | 99.0/0.7/0.3 | 0.95 | 1.81 | Present invention |
| 13-13 | Air | Air | *b | 99.3/0.6/0.1 | 0.97 | 1.80 | Present invention |
| 13-14 | Air | Air | *1*b | 99.3/0.5/0.2 | 0.99 | 1.74 | Present invention |

*a: Heating at 120° C. for 30 minutes
*b: Heating at 120° C. for 60 minutes
*c: Heating at 120° C. for 90 minutes
*1: Under reduced pressure As shown in Table XIII, for lighting devices 13-8 to 13-14 in which oxide B was formed by using the air coating process, it was found that lighting devices with a long lifetime were manufactured at 85° C. and 85% RH, where the air easily penetrates into the device and causes light emission inhibition. Further, in the lighting devices 13-9 to 13-14 which do not perform heating and drying under the atmosphere at the time of film formation of the light emitting layer, it can be seen that generation of other components such as decomposition products which are produced by-products is suppressed and EQE can be maintained. In particular, in the processes of the lighting devices 13-9 and 13-10, it can be seen that, despite the lowest-cost process in which an inert gas environment or a reduced-pressure environment is not used, the generation of other components is suppressed, and high initial luminescence and atmospheric storage stability are compatible.

INDUSTRIAL APPLICATIONS

The luminescent thin film and the luminescent multilayer film of the present invention may be suitably provided to an organic EL element for a lighting device, a display, and various light-emitting light source applications because the luminescent characteristics are excellent in storage stability under the atmosphere. They may be effectively used in applications such as home lighting, vehicle interior lighting, backlight for watches and liquid crystals, billboard advertisement, traffic light, light source of optical storage medium, light source of electrophotographic copying machine, light source of optical communication processor, light source of optical sensor, backlight of a liquid crystal display device combined with a color filter.

DESCRIPTION OF SYMBOLS

10: Multilayer film
20: Base material
30: First coating
40: Second coating
100: Organic EL element
110: Flexible support substrate
120: Anode
130: Hole injection layer
140: Hole transport layer
150: Light-emitting layer
160: Electron transport layer
170: Electron injection layer
180: Cathode
190: Sealing adhesive
200: Organic functional layer
210: Flexible sealing member

What is claimed is:

1. A luminescent thin film comprising a luminescent compound A, wherein the luminescent thin film contains 0.0001 mass % or more of an oxide B of the luminescent compound A with respect to the luminescent compound A, the luminescent compound A is a phosphorescent compound, and
a molecular weight of the oxide B satisfies the following Equation (1), $$Mw(B)=Mw(A)+(16m+18n) \qquad \text{Equation (1):}$$

wherein Mw(A) represents a molecular weight of the luminescent compound A, Mw(B) represents a molecular weight of the oxide B, m and n each represent 0 or an integer, respectively, provided that $m+n \geq 1$.

2. The luminescent thin film described in claim 1, wherein a content of the oxide B is in the range of 0.001 to 100 mass % with respect to the luminescent compound A.

3. The luminescent thin film described in claim 1, wherein the phosphorescent compound is a phosphorescent complex containing a 5-membered heterocyclic skeleton.

4. The luminescent thin film described in claim 1, wherein the oxide B has any one of a hydroxy group, a phenolic hydroxy group, an epoxy group, and a carbonyl group.

5. A luminescent multilayer film comprising a first layer and a second layer in this order, wherein the first layer is the luminescent thin film described in claim 1.

6. The luminescent multilayer film described in claim 5, wherein the second layer contains a compound having a lone electron pair.

7. The luminescent multilayer film described in claim 6, wherein the compound having the lone electron pair is a nitrogen-containing compound.

8. The luminescent multilayer film described in claim 5, wherein the second layer contains a fluorine compound.

9. The luminescent multilayer film described in claim 8, wherein the fluorine compound functions as a fluorine solvent at normal temperature and normal pressure.

10. The luminescent multilayer film described in claim 9, wherein a content of the fluorine solvent is in the range of 0.01 to 10 mass %.

11. An organic electroluminescent element comprising the luminescent thin film described in claim 1 between a pair of electrodes.

12. The organic electroluminescent element described in claim 11, wherein at least one of the electrodes has a work function of 4.2 eV or more.

13. A method of manufacturing the luminescent thin film described in claim 1, the method comprising the steps of:
forming a first coating film on a base material using a coating solution A in an atmospheric environment (step A); and drying the first coating film with carrying out a drying process other than atmospheric pressure heat drying in an atmospheric environment.

14. A method of manufacturing the luminescent multilayer film described in claim 5, the method comprising the steps of:

forming a first coating film on a base material using a coating solution A in an atmospheric environment (step A);

drying the first coating film with carrying out a drying process other than atmospheric pressure heat drying in an atmospheric environment;

forming a second coating film on the first coating film using a coating solution B different from the coating solution A in an atmospheric environment (step B); and drying the first coating film and the second coating film in an atmospheric environment (step C) after the step B, provided that the first coating film and the second coating film are formed in this order.

15. A method of manufacturing a luminescent multilayer film described in claim 5, the method comprising the steps of:

forming a first coating film on a base material using a coating solution A in an atmospheric environment (step A);

forming a second coating film on the first coating film using a coating solution B different from the coating solution A in an atmospheric environment (step B) after the step A; and drying the first coating film and the second coating film in an atmospheric environment (step C) after the step B; provided that the first coating film and the second coating film are formed in this order.

16. A method of manufacturing an organic electroluminescent element, comprising the step of manufacturing the luminescent thin film described in claim 13.

17. An organic electroluminescent element comprising the luminescent multilayer film described in claim 5 between a pair of electrodes.

18. A method of manufacturing an organic electroluminescent element, comprising the step of manufacturing the luminescent multilayer film described in claim 14.

19. The luminescent thin film described in claim 1, wherein a content of the oxide B is in the range of 1 to 100 mass % with respect to the luminescent compound A.

* * * * *